(12) United States Patent
Dodoc

(10) Patent No.: US 7,848,016 B2
(45) Date of Patent: Dec. 7, 2010

(54) HIGH-NA PROJECTION OBJECTIVE

(75) Inventor: Aurelian Dodoc, Heidenheim an der Brenz (DE)

(73) Assignee: Carl Zeiss SMT AG, Oberkochen (DE)

( * ) Notice: Subject to any disclaimer, the term of this patent is extended or adjusted under 35 U.S.C. 154(b) by 814 days.

(21) Appl. No.: 11/797,571

(22) Filed: May 4, 2007

(65) Prior Publication Data

US 2008/0007822 A1    Jan. 10, 2008

Related U.S. Application Data

(60) Provisional application No. 60/797,672, filed on May 5, 2006.

(30) Foreign Application Priority Data

May 5, 2006    (EP) .................................. 06009291

(51) Int. Cl.
*G02B 17/08* (2006.01)

(52) U.S. Cl. .................................................. 359/365

(58) Field of Classification Search ......... 359/364–366, 359/649, 713
See application file for complete search history.

(56) References Cited

U.S. PATENT DOCUMENTS

| | | | |
|---|---|---|---|
| 5,257,133 A | 10/1993 | Chen | |
| 6,600,608 B1 | 7/2003 | Shafer et al. | |
| 7,079,314 B1 | 7/2006 | Suenaga et al. | |
| 2002/0012100 A1 | 1/2002 | Shafer | |
| 2002/0024741 A1 | 2/2002 | Terasawa et al. | |
| 2003/0011755 A1 | 1/2003 | Omura et al. | |
| 2003/0197946 A1 | 10/2003 | Omura | |

(Continued)

FOREIGN PATENT DOCUMENTS

EP    0 532 267 A1    3/1993

(Continued)

OTHER PUBLICATIONS

Tomoyuki Matsuyama, et al "Nikon Projection Lens Update", Optical Microlithography XVII, Proc of SPIE 5377.65 (2004).

(Continued)

*Primary Examiner*—Mark Consilvio
(74) *Attorney, Agent, or Firm*—Sughrue Mion, PLLC

(57) ABSTRACT

A catadioptric projection objective for imaging a pattern provided in an object surface onto an image surface of the projection objective has an object-side imaging subsystem for creating a final intermediate image closest to the image surface from radiation coming from the object surface and an image-side imaging subsystem for directly imaging the final intermediate image onto the image surface. The image-side imaging subsystem includes a last optical element closest to the image surface and is designed for creating a convergent beam having an aperture $\sin \alpha \geq 0.8$ in the last optical element. The image-side imaging subsystem includes, in this order along a propagation direction of radiation: a primary negative lens group having overall negative refractive power; an intermediate positive lens group having overall positive refractive power; a secondary negative lens group having overall negative refractive power; and a final positive lens group having overall positive refractive power and including the last optical element, where the last optical element has a convex entry surface having a radius $R_{LOE}$ of curvature with $R_{LOE}/NA<40$ mm.

38 Claims, 6 Drawing Sheets

U.S. PATENT DOCUMENTS

| | | |
|---|---|---|
| 2004/0130806 A1 | 7/2004 | Takahashi |
| 2005/0190435 A1 | 9/2005 | Shafer et al. |
| 2005/0248856 A1 | 11/2005 | Omura et al. |
| 2006/0012885 A1 | 1/2006 | Beder et al. |
| 2006/0028715 A1 | 2/2006 | Kato et al. |
| 2006/0221456 A1 | 10/2006 | Shafer et al. |

FOREIGN PATENT DOCUMENTS

| | | |
|---|---|---|
| EP | 0 989 434 A2 | 3/2000 |
| EP | 1 069 448 A1 | 1/2001 |
| EP | 1 336 887 A1 | 8/2003 |
| JP | 2002-208551 A | 7/2002 |
| WO | WO 03/036361 A1 | 5/2003 |
| WO | WO 2004/019128 A2 | 3/2004 |
| WO | WO 2004/107011 A1 | 12/2004 |
| WO | WO 2005/040890 A1 | 5/2005 |
| WO | WO 2005/059654 A1 | 6/2005 |
| WO | WO 2005/069055 A2 | 7/2005 |
| WO | WO 2005/098504 A1 | 10/2005 |

OTHER PUBLICATIONS

Joseph Meiron, "On the Design of Optical Systems Containing Aspheric Surfaces", Journal of the Optical Society of America, vol. 46, No. 4, Apr. 1956, pp. 288-292.

HIGH-NA PROJECTION OBJECTIVE

This application claims benefit of U.S. Provisional Application No. 60/797,672, filed May 5, 2006, and additionally claims priority to European. Application 06009291.3, also filed May 5, 2006.

BACKGROUND OF THE INVENTION

1. Field of the Invention

The present invention relates to a catadioptric projection objective for imaging a pattern provided in an object surface of the projection objective onto an image surface of the projection objective. The projection objective may be used for microlithography projection exposure machines. The invention relates, in particular, to exposure machines for semiconductor structures which are designed for immersion operation in an aperture range where the image-side numerical aperture NA is greater than 1.0.

2. Description of the Related Art

In the case of reducing optical imaging, in particular in the field of projection lithography, the image-side numerical aperture NA is limited by the refractive index of the surrounding medium in image space adjacent to the image surface of the projection objective. In immersion lithography the theoretically possible numerical aperture NA is limited by the refractive index of the immersion medium.

The immersion medium can be a liquid or a solid. An immersion liquid is disposed between an exit surface of the projection objective and the surface of the substrate to be exposed, which is arranged in the image surface. In contact-free solid immersion a planar exit surface of the projection objective is arranged at a working distance smaller than the operating wavelength to the substrate to be exposed such that evanescent fields emerging from the exit surface can be used for imaging (near-field lithography). Solid immersion with touching contact between the exit surface of the projection objective and the substrate is also possible.

The theoretical limit for image-side numerical aperture is normally not reached, since the propagation angles between the rays limiting the beam bundle and the optical axis then become very large. As a rule, NA should not substantially exceed approximately 95% of the refractive index of the last medium on the image side. For 193 nm, this corresponds to a numerical aperture of NA=1.35 in the case of water ($n_{H2O}$=1.43) as immersion medium.

With immersion liquids whose refractive index is higher than that of the material of the last optical element with refractive power (also denoted last lens), or in the case of solid immersion, the refractive index of the material of the last lens (i.e. the last optical element of the projection objective adjacent to the image surface) acts as a limitation if the design of the exit surface of the projection objective is to be planar or only weakly curved. The planar design is advantageous, for example, for measuring the distance between wafer and objective, for hydrodynamic behaviour of the immersion medium between the wafer to be exposed and the exit surface of the projection objective, and for their cleaning. A further advantage of the planar design of the exit surface is that changes of the refractive index of the immersion liquid have little influence on the image quality. Such changes of the refractive index can be caused by changes of temperature, for example.

The exit surface must be of planar design for solid immersion, in particular, in order to expose the wafer, which is likewise planar.

For DUV (deep ultraviolet, operating wavelength of 248 nm or 193 nm), the materials normally used for the last optical element are fused silica (synthetic quartz glass, $SiO_2$) with a refractive index of $n_{SiO2}$=1.56 at 193 nm or $CaF_2$ with a refractive index of $n_{CaF2}$=1.50 at 193 nm. Given the limitations mentioned above, a numerical aperture of approximately NA=1.425 (95% of n=1.5) might be achieved if calcium fluoride is used for the last optical element. Using fused silica instead would allow numerical apertures of NA=1.48 (corresponding to approximately 95% of the refractive index of quartz at 193 nm). The relationships are similar at 248 nm.

It is contemplated that projection objectives having NA values in the range between about 1.35 and about 1.50 will become desirable in the near future. High NA values in this range and above can be obtained, for example, if at least one optical element in the projection objective is a high-index optical element made from a high-index material with a refractive index higher than that of fused silica, for example with $n \geq 1.6$ at the operating wavelength. For example, the high-index material may be sapphire which forms at least partly the last refractive optical element of the projection objective. Examples are shown in U.S. patent application with Ser. No. 11/151,465 and title: "Projection objective having high aperture and planar end surface" filed on Jun. 14, 2005 by the applicant. However, high-index materials in an optical quality suitable for this purpose are in limited supply and procedures for reproducably treating such materials during manufacturing are still being developed. Therefore it would be desirable to be able to produce very high NA projection objectives using only lenses made of established materials, such as fused silica. If, for example, a last optical element of a projection objective would be made of fused silica with $n_{SiO2}$=1.56 at 193 nm an increase in image-side numerical aperture towards the limit value NA=1.56 requires that very high propagation angles α are present in the last optical element. This is demonstrated by table A where the image side numerical aperture NA is listed together with the propagation angle α between marginal rays and the surface normal to the planar exit surface of the projection objective (in most cases equal to half the opening angle of a beam bundle within the last optical element), and the respective sine of that maximum propagation angle α, which is the corresponding aperture sin α.

TABLE A

| NA | α [°] | Aperture sin α |
|---|---|---|
| 1.35 | 59.9 | 0.865 |
| 1.40 | 63.8 | 0.897 |
| 1.45 | 68.3 | 0.929 |
| 1.50 | 74.0 | 0.961 |

It is difficult to control very high aperture values in the region of sin $\alpha \geq 0.8$ or sin $\alpha \geq 0.9$ with regard to optical correction. Since the outer marginal rays impinge at very large angles, small angular deviations lead to large offsets between an ideal image point and an actual image point with regard to geometrical lateral offsets. The geometrical optical aberrations as well as the aberrations of the wavefront have to be kept very low to obtain sufficient imaging fidelity.

The correction of chromatic aberrations (color correction) is an other problem in systems designed for wavelengths below about 260 nm since the Abbe numbers of those transparent materials that are available lie rather close to one another.

Further, in lithography, a flat (planar) image is essential to expose planar substrates, such as semiconductor wafers.

However, generally the image surface of an optical system is curved, and the degree of curvature is determined by the Petzval sum. The correction of the Petzval sum is becoming more important in view of the increasing demands to project large object fields on planar surfaces with increased resolution.

One approach for obtaining a flat image surface and good color-correction is the use of catadioptric systems, which combine both refracting elements, such as lenses, and reflecting elements, such as mirror, preferably including at least one concave mirror. While the contributions of positive-powered and negative-powered lenses in an optical system to overall power, surface curvature and chromatic aberrations are opposite to each other, a concave mirror has positive power like a positive-powered lens, but the opposite effect on surface curvature without contributing to chromatic aberrations.

Further, the high prices of the materials involved and limited availability of crystalline calcium fluoride in sizes large enough for fabricating large lenses represent problems. It is known that, for a given size of the image field, the lens diameters generally increase as NA increases. This is partly due to the moderate refractive indices available for lenses in positions having large aperture values, particularly close to the image surface. However, large lens diameters are not desirable due to the limited availability of optical material in sufficient quality and also because the mechanical stability is negatively affected and the optical systems tend to become axially large. One means for reducing lens diameters would be to use large local concentrations of refractive powers. However, it is known that the contribution of lenses to aberrations roughly scales with the refractive power such that the aberration contributions increase as the refractive power increases.

Measures that will allow reducing the number and sizes of lenses and simultaneously contribute to maintaining, or even improving, imaging fidelity are thus desired.

In recent years, a number of catadioptric projection objectives have been proposed having a first, refractive imaging objective part for imaging the pattern provided in the object plane into a first intermediate image, a second, catoptic or catadioptric imaging objective part for imaging the first intermediate image into a second intermediate image, and a third refractive imaging objective part for imaging the second intermediate image directly onto the image plane. In a notation where "R" denotes a refractive imaging objective part, "C" denotes a catadioptric or catoptric objective part and "–" denotes an intermediate image, this type is briefly denoted as "R-C-R". The first refractive objective part may be designed to obtain a suitable position, shape and correction status of the first intermediate image. The second objective part typically includes at least one concave mirror and may be designed to contribute substantially to Petzval sum correction. A primary task of the third, refractive objective part is to provide the high image-side numerical aperture and to correct aberrations associated therewith, particularly spherical aberration and coma. The terms "subsystem" and "objective part" will alternatively be used in this specification to denote a number of subsequent optical elements of the projection objective effective, in combination, as an "imaging system" for imaging a field into an optically conjugate field US 2005/0190435 discloses catadioptric projection objectives having very high NA and suitable for immersion lithography at NA>1 with maximum values NA=1.2. The projection objectives comprise: a first refractive objective part for imaging the pattern provided in the object plane into a first intermediate image, a second objective part for imaging the first intermediate image into a second intermediate image, and a third refractive objective part for imaging the second intermediate image directly onto the image plane. The second objective part includes a first concave mirror having a first continuous mirror surface and a second concave mirror having a second continuous mirror surface, the concave mirror faces facing each other and defining an intermirror space. All concave mirrors are positioned optically remote from pupil surfaces. The system has potential for very high numerical apertures at moderate lens mass consumption. The full disclosure of this document and the priority documents thereof is incorporated into the present application by reference.

Catadioptric projection objectives including a catadioptric imaging objective part having one single concave mirror and arranged between an entry side and an exit side refractive imaging objective part are disclosed, for example, in U.S. application with Ser. No. 60/573,533 filed on May 17, 2004 by the applicant. Other examples of single-mirror R-C-R-systems are shown in US 2003/0011755, WO 03/036361, WO 2004/019128 or US 2003/0197946.

U.S. Pat. No. 6,600,608 B1 discloses a catadioptric projection objective having a first, purely refractive objective part for imaging a pattern arranged in the object plane of the projection objective into a first intermediate image, a second objective part for imaging the first intermediate image into a second intermediate image and a third objective part for imaging the second intermediate image directly, that is without a further intermediate image, onto the image plane. The second objective part is a catadioptric or catoptric objective part having a first concave mirror with a central bore and a second concave mirror with a central bore, the concave mirrors having the mirror faces facing each other and defining an intermirror space or catadioptric cavity in between. The first intermediate image is formed within the central bore of the concave mirror next to the object plane, whereas the second intermediate image is formed within the central bore of the concave mirror next to the object plane. The objective has axial symmetry and provides good color correction axially and laterally. However, since the reflecting surfaces of the concave mirrors are interrupted at the bores, the pupil of the system is obscured.

The Patent EP 1 069 448 B1 discloses another catadioptric projection objective having two concave mirrors facing each other. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors are disclosed in Japanese patent application JP 2002208551 A and US patent application US 2002/0024741 A1.

European patent application EP 1 336 887 (corresponding to US 2004/0130806 A1) discloses catadioptric projection objectives having one common straight optical axis and, in that sequence, a first catadioptric objective part for creating a first intermediate image, a second catadioptric objective part for creating a second intermediate image from the first intermediate image, and a refractive third objective part forming the image from the second intermediate image. Each catadioptric system has two concave mirrors facing each other. The intermediate images lie outside the intermirror spaces defined by the concave mirrors. Concave mirrors are positioned optically near to pupil surfaces closer to pupil surfaces than to the intermediate images of the projection objectives.

International Patent application WO 2004/107011 A1 discloses catadioptric projection objectives having one common straight optical axis and two or more intermediate images which are suitable for immersion lithography with numerical apertures up to NA=1.2. At least one concave mirror is positioned optically near to a pupil surface closer to that pupil surface than to an intermediate images of the projection objective.

In the article "Nikon Projection Lens Update" by T. Matsuyama, T. Ishiyama and Y. Ohmura, presented by B. W. Smith in: Optical Micro-lithography XVII, Proc. of SPIE 5377.65 (2004) a design example of a catadioptric projection lens is shown, which is a combination of a conventional dioptric DUV system and a 6-mirror EUV catoptric system inserted between lens groups of the DUV system. A first intermediate image is formed behind the third mirror of the catoptric (purely reflective) group upstream of a convex mirror. The second intermediate image is formed by a purely reflective (catoptric) second objective part. The third objective part is purely refractive featuring negative refractive power at a waist of minimum beam diameter within the third objective part for Petzval sum correction.

SUMMARY OF THE INVENTION

It is one object of the invention to provide a catadioptric projection objective with potential for very high image-side NA with optical correction means suitable to correct aberrations originating from high aperture values sin α≧0.8 or sin α≧0.9 within a last refracting optical element of the projection objective. It is another object of the invention to provide a catadioptric projection objective with an image-side numerical aperture NA≧1.35 that can be manufactured using established lens materials, particularly fused silica, only. It is yet another object of the invention to provide a catadioptric projection objective with ultra high image-side numerical aperture and relatively small maximum size of lenses.

As a solution to these and other objects, this invention, according to one formulation, provides a catadioptric projection objective for imaging a pattern provided in an object surface of the projection objective onto an image surface of the projection objective comprising:

a catadioptric object-side imaging subsystem for creating a final inter mediate image closest to the image surface from radiation coming from the object surface;

a refractive image-side imaging subsystem for directly imaging the final intermediate image onto the image surface;

the image-side imaging subsystem including a last optical element closest to the image surface and being designed for creating a convergent beam having an aperture sin α≧0.8 in the last optical element to provide an image-side numerical aperture NA;

the image-side imaging subsystem including in this order along a propagation direction of radiation:

a primary negative lens group having overall negative refractive power;

an intermediate positive lens group having overall positive refractive power;

a secondary negative lens group having overall negative refractive power; and a final positive lens group having overall positive refractive power and including the last optical element, where the last optical element has a convex entry surface having a radius $R_{LOE}$ of curvature with $R_{LOE}$/NA<40 mm.

Generally, a "lens group" may include one single lens or a number of at least two immediately consecutive lenses. In a "negative lens group" the overall effect of the lenses of the lens group corresponds to negative refractive power. Although each lens of a multiple-lens lens group may be a negative lens, it is also possible that a "negative lens group" includes one or more single lenses having positive refractive power. Likewise, the positive refractive power provided by a "positive lens group" may be provided by one or more lenses, at least one of that lenses being a positive lens, where one or more negative lenses may also be included in a positive lens group. With "N" denoting a negative lens group and "P" denoting a positive lens group this sequence may be characterized briefly as "N P N P".

It has been found that providing negative lens groups at different positions within the image-side imaging subsystem and separated by a positive lens group (intermediate positive lens group) with generally converging effect on the transiting radiation, large contributions to correction of aperture-dependent aberrations, such as spherical aberration and coma, can be provided even with spherical lens surfaces. The effect may be complemented and completed by providing aspheric lens surfaces of appropriate shape at selected positions. Since a framework of suitably curved and distributed spherical lens surfaces may provide a major contribution to correction, relatively small numbers of aspheric lens surfaces may be sufficient to correct residual aberrations.

Further, it has been found useful to concentrate positive refractive power close to the image surface. Therefore, the final positive lens group having overall positive refractive power includes a last optical element (closest to the image surface) having a convex entry surface having a radius $R_{LOE}$ of curvature according to $R_{LOE}$/NA<40 mm. If this condition is fulfilled, the last optical element has large refractive power (short focal length) thereby contributing to small maximum diameters of lenses in the image-side imaging subsystem even at very high NA-values, such as NA≧1.35 or even NA>1.4.

In embodiments for very high NA values it has been found beneficial to provide a primary positive lens group having overall positive refractive power arranged between the final intermediate image and the primary negative lens group, whereby a sequence "P N P N P" is obtained. In these embodiments, positive refractive power provided close to the final intermediate image contributes to "capturing" the marginal rays of outer field points, thereby avoiding extremely large lens diameters downstream of the primary positive lens group.

The secondary negative lens group interposed between the intermediate and final positive lens groups may be generally positioned in the region of largest beam diameter within the image-side imaging subsystem. A major contribution to correction of spherical aberration, coma and astigmatism can thereby be obtained. Preferably, at least one negative lens in the secondary negative lens group is arranged in the region of a local maximum of beam diameter where the beam diameter exceeds 80% of the maximum beam diameter.

The secondary negative lens group can also be positioned in a region of ascending beam diameters, between the region of the lowest beam diameter and the region with the maximum beam diameter. This position facilitates high incidence angles, whereby a strong contribution to the correction of the above mentioned aberrations can be obtained.

On the other hand, negative refractive power provided by the primary negative lens group is preferably concentrated in a region of substantially smaller beam diameter, particularly at or close to a local minimum of the beam diameter. Preferably, at least one negative lens of the primary negative lens group is arranged in the region of a local minimum of beam diameter within the image-side imaging subsystem. The absolute value of the negative refractive power concentrated in the region or relatively small beam diameter should be high. In this region, a large contribution to correction of spherical aberration and coma and field curvature is provided.

Preferably, at least one negative lens of the primary negative lens group has a concave exit surface (facing the image surface) where large angles of incidence angles occur. The aspect of very high angles of incidence occurring at a lens surface may be quantified by the maximum value for the sine of the angle of incidence (SINIMAX) on that surface. Values SINIMAX>0.93 and/or SINIMAX>0.95 appear beneficial in that region.

It is to be understood that these values correspond to the incidence angles given when the projection objective is used with maximum NA. The "sine of the angle of incidence" of a ray at a surface is understood as the sine of the angle i of incidence enclosed by the light ray and the surface normal at the point of impingement. The "maximum sine of the angle of incidence" (SINIMAX) at a surface is understood as the maximum value of the sine of the angle of incidence over all light rays impinging on this surface.

These concave surfaces may have a significant overcorrecting effect on spherical aberration and coma. If at least one of the concave exit surfaces is an aspheric surface, then the contributions to the higher order aberrations can be adjusted appropriately.

Preferably, the marginal ray angles MRA of rays within the secondary negative lens group are significantly smaller than those within the primary negative lens group. Specifically, the condition $MRA2_{max} < MRA1_{max}$ should be fulfilled, where $MRA2_{max}$ and $MRA1_{max}$ are the maximum values of the marginal ray angle within the secondary and primary negative lens group, respectively.

It is preferred that the secondary negative lens group is positioned such that an essentially collimated beam enters that lens group.

Preferably, at least one lens of the secondary negative lens group has a concave entry surface facing the object surface. The concave surface may be provided on a negative lens. Preferably, the concave entry surface may be an aspheric surface.

In an embodiment, a primary chief ray height CRH1 in a center region of the primary negative lens group is larger than the secondary chief ray height CRH2 in a center region of the secondary negative lens group and a primary marginal ray height MRH1 in the primary negative lens group is smaller than a secondary marginal ray height MRH2 within the secondary negative lens group. Arranging the negative lens groups such that different relations between ray heights of chief ray and marginal rays occur in the spatially separated negative lens groups has been found to be beneficial for overall correction since a strong decoupling of targeted correction of spherical aberration and coma is possible.

The final positive lens group adjacent to the image surface normally extends across the pupil surface of the image-side imaging subsystem, which is the pupil surface closest to the image surface. A number of positive lenses is typically arranged between that pupil surface and the image surface. In this region, meniscus-shaped positive lenses having concave exit surfaces facing the image surface are preferred. This shape allows to limit the contributions of theses lenses to spherical aberration and coma to a minimum. Since large image fields are typically desired, these lenses may not be aplanatic, but they may be essentially aplanatic to reduce the field variation of aberrations. The concave surfaces may be formed aspherical to reduce the aberrations of the marginal rays by reducing the angles of incidence. For large NA systems, those aberrations strongly dependent on the aperture, such as spherical aberration and coma, will dominate. In such systems, the correcting means may be optimized particularly for these aberrations.

According to a specific aspect of the invention the shape of selected aspheric surfaces is optimized such that a contribution to lens diameter reduction is obtained. Specifically, aspheric surfaces may be provided which reduce beam divergence or which enhance beam convergence at the surfaces provided with an aspheric shape. According to an embodiment, at least one aspheric lens surface arranged in a region of convergent beam is designed as a convergence-enhancing aspheric surface according to $MRA_{AS}/MRA_S > 1.2$, where $MRA_{AS}$ is a marginal ray angle immediately downstream of the aspheric lens surface and $MRA_S$ is a value for the marginal ray angle in the absence of an aspheric deformation at a corresponding spherical base lens surface. Likewise, at least one aspheric lens surface arranged in a region of diverging beam may be designed as a divergence-reducing aspheric surface according to $MRA_S/MRA_{AS} > 1.2$.

In some embodiments the image-side imaging subsystems includes an axially extended partial section where the lenses have almost the same free (utilized) diameters and where the beam is essentially collimated. That partial section has an axial length $L_C$ according to $L_C > 0.5\, D_{MAX}$, where $D_{MAX}$ is a maximum lens diameter within the image-side imaging subsystem. Providing an extended region of essentially collimated beam allows to provide a multitude of correction means effective at large diameters, such as combinations of positive and negative lenses, whereby a decoupling between field-dependent and aperture-dependent aberrations can be increased.

In embodiments adapted for using an immersion medium in the image space it has been found useful to provide a last optical element having an edge thickness $ET_{LOE}$ according to $ET_{LOE} < NA \times 10$ [mm], where the edge thickness is the thickness of the last optical element at the edge of the optically utilized area measured in the direction of the optical axis. Preferably, $ET_{LOE}$ may be smaller than 14 mm or even smaller than 10 mm. This contributes to an axially compact design. Further, a significant deflection of rays of a beam bundle with a very large opening angle close to the image surface is obtained, thereby reducing the maximum values of lens diameters upstream of the last optical element, particularly between the pupil surface of the image-side imaging subsystem and the image surface.

As mentioned above, it may be beneficial to increase the refractive power of the last optical element in order to concentrate refractive power close to the image surface. Where the last optical element is a plano-convex lens having a convex entry side and a plane exit side, the refractive power of that lens only depends on the refractive power of the convex entry surface, whereas the thickness of the lens (axial distance between entry surface and exit surface) and the plane exit surface do not contribute. Preferably, the radius of curvature of the convex entry surface is smaller than 50 mm.

The invention may be used in various types of catadioptric projection objectives. In preferred embodiments, the object-side imaging subsystem includes a first refractive imaging subsystem to generate a first intermediate image from radiation coming from the object surface, and a second, catadioptric or catoptric imaging subsystem for imaging the first intermediate image into the final intermediate image. In these embodiments, the object-side imaging subsystem is formed by two concatenated imaging subsystems, whereby a projection objective of type R-C-R is obtained. The second, catadioptric or catoptric imaging subsystem may include one or more concave mirrors. Where only one single concave mirror is provided, the part of the optical axis defined by the symmetry axis of the concave mirror will be inclined with respect to the optical axis defined by the refractive subsystems upstream and downstream of the imaging subsystem including the concave mirror. One or more folding mirrors may be provided. In systems having two concave mirrors (or another even number of concave mirrors) also in-line systems with one straight (unfolded) optical axis common to all lenses and mirrors may be designed.

In an embodiment, where the first imaging subsystem has a first axial length L1 measured between the entry surface facing the object surface and the exit surface facing the first intermediate image, and the image-side imaging subsystem has an axial length $L_{ISIS}$ measured between the entry surface facing the final intermediate image and the exit surface facing the image surface, the condition $L_{ISIS} > 1.8$ L1 is fulfilled. Preferably, $L_{ISIS} > 2.5$ L1.

Implementing the invention allows to manufacture a projection objective wherein the last optical element is made of a material having refractive index $n_{LOE}$ and wherein the image-side numerical aperture is in the range $0.95 * n_{LOE} < NA < n_{LOE}$. With other words: Very high propagation angles within the last optical element become controllable with respect to aberration correction. For systems designed for use with wavelength $\lambda = 193$ nm the last optical element may be made of fused silica and the image-side numerical aperture may be in the range $1.35 \leq NA \leq 1.50$. If desired, all refractive optical elements may be made of the same material, such as fused silica, and $1.35 \leq NA \leq 1.50$ may be obtained for systems designed for use with wavelength $\lambda = 193$ nm.

In some embodiments designed for use with an immersion liquid having refractive index $n_{IL}$ all refractive optical elements are made of the same material, such as fused silica, and the condition $NA/n_{IL} > 0.92$ holds.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of preferred embodiments of the invention, the term "optical axis" shall refer to a straight line or sequence of straight-line segments passing through the centers of curvature of the optical elements involved. The optical axis can be folded by folding mirrors (deflecting mirrors). In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Selected rays will be used to characterize specific features of the invention. The term "marginal ray" as used here defines a ray emanating from an off-axis object point and running to the edge of an aperture stop limiting the diameter of the beam-bundle and placed at or close to a pupil surface of the projection objective. The term "upper marginal ray" refers to a marginal ray having an increasing distance to the optical axis in propagation direction, i.e. running away from the optical axis near the object surface. The term "lower marginal ray", in contrast, refers to a marginal ray having a decreasing distance to the optical axis in propagation direction, i.e. running towards the optical axis near the object surface. A "chief ray" is a ray running from an outermost field point (farthest away from the optical axis) parallel to or at small angle with respect to the optical axis and intersecting the optical axis at a pupil surface position.

Where tables are provided to disclose the specification of a design shown in a figure, the table or tables are designated by the same numbers as the respective figures.

Figure 1:
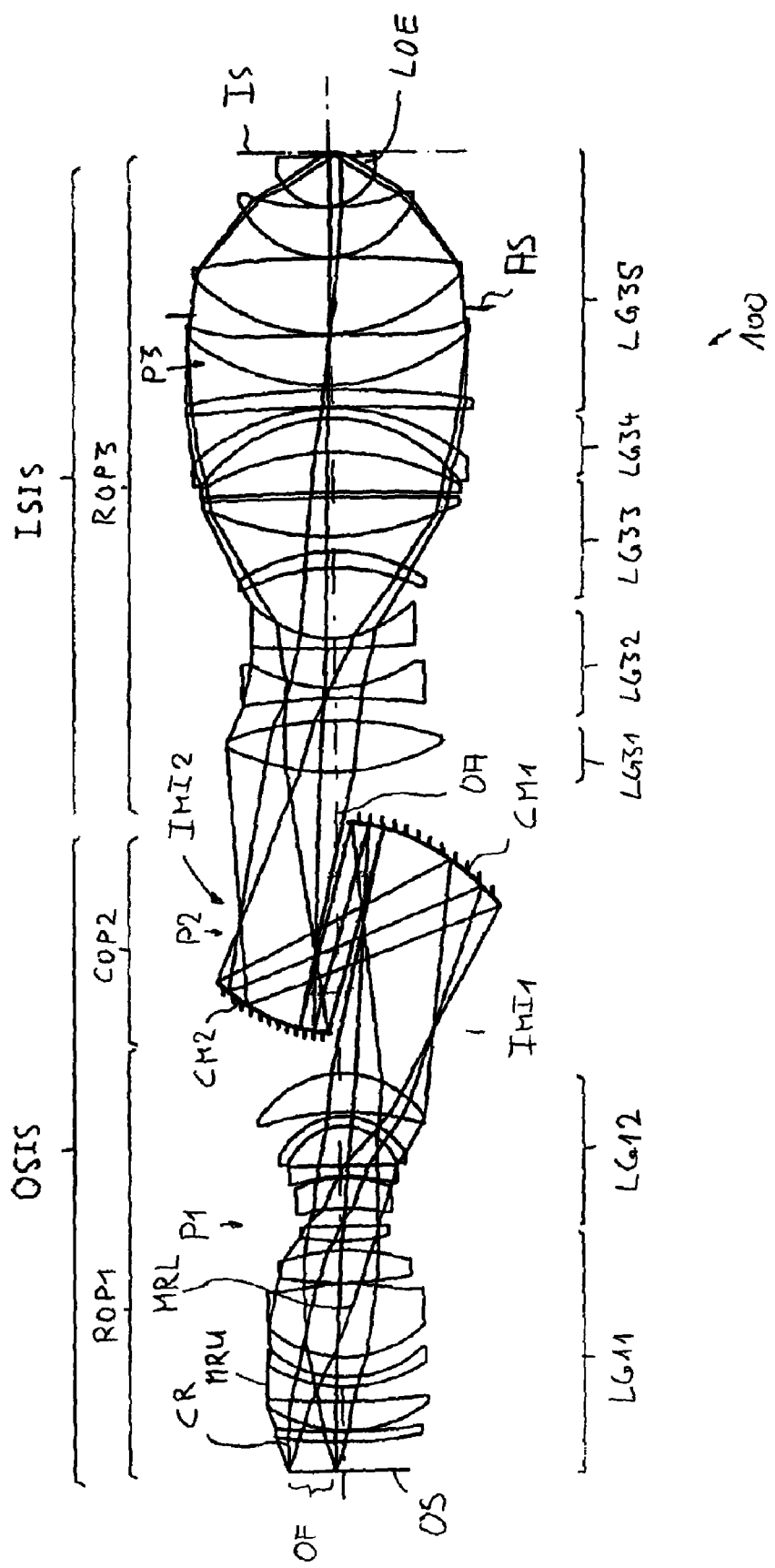
FIG. 1 is a longitudinally sectioned view (meridional section) of a first embodiment of a catadioptric projection objective according to the invention with NA=1.35.

FIG. 1 shows a first embodiment of a catadioptric projection objective 100 according to the invention designed for about 193 nm UV working wavelength. It is designed to project an image of a pattern on a reticle (or mask) arranged in the planar object surface OS into the planar image surface IS on a reduced scale, for example, 4:1, while creating exactly two real intermediate images IMI1 and IMI2. A first refractive objective part ROP1 is designed for imaging the pattern arranged in the region of the object field OF in the object surface into the first intermediate image IMI1, a second, catoptric (purely reflective) objective part COP2 images the first intermediate image IMI1 into the second intermediate image IMI2, and a third, refractive objective part ROP3 images the second intermediate image IMI2 onto the image surface IS with a strong reduction ratio.

The second objective part COP2 comprises a first concave mirror CM1 having the concave mirror surface facing the object side, and a second concave mirror CM2 having the concave mirror surface facing the image side. The mirror surfaces are both continuous or unbroken, i.e. they do not have a hole or bore. The mirror surfaces facing each other define an intermirror space, enclosed by the curved surfaces defined by the concave mirrors. The intermediate images IMI1, IMI2 (at least the paraxial intermediate images) are both situated geometrically inside the intermirror space apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry. The projection objective is rotational symmetric and has one straight optical axis OA common to all refractive and reflective optical components (in-line system). There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting.

Catadioptric projection objectives having this general construction are disclosed e.g. in the U.S. patent application with Ser. No. 11/035,103 filed on Jan. 14, 2005, published as US 2005/0190435 A1. The contents of this application are incorporated into this application by reference. It is one characterizing feature of this type of catadioptric projection objectives that all concave mirrors are arranged optically remote from a pupil surface, particularly at positions where the chief ray height of the imaging process exceeds a marginal ray height of the imaging process. Further, it is preferred that at least the first intermediate image is located geometrically within the intermirror space. Preferably both intermediate images are located geometrically within the intermirror space. This basic type of design allows immersion lithography at numerical apertures NA>1 with optical systems that can be built with relatively small amounts of optical material.

The specifications for the design of FIG. 1 are summarized in Table 1. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the refractive index of the material employed for its fabrication. The sixth column lists the optically utilizable, clear, semi diameter [mm] of the optical component. In the tables, a radius value r=0 is given for planar surfaces having infinite radius.

A number of optical surfaces are aspherical surfaces. Table 1A lists the associated data for those aspherical surfaces, from which the sagitta of their surface figures as a function of the height h may be computed employing the following equation:

$$p(h)=[((1/r)h^2)/(1+\text{SQRT}(1-(1+K)(1/r)^2 h^2))]+C1 \cdot h^4+C2 \cdot h^6+\ldots,$$

where the reciprocal value (1/r) of the radius is the curvature of the surface in question at the surface vertex and h is the distance of a point thereon from the optical axis. The sagitta p(h) thus represents the distance of that point from the vertex of the surface in question, measured along the z-direction, i.e., along the optical axis. The constants K, C1, C2, etc., are listed in Table 1A.

The projection objective 100 is designed for microlithography at 193 nm at an image-side working distance of about 2.8 mm and has an image-side numerical aperture NA=1.35 at an image field size 5.5 mm*26 mm, where the off-axis rectangular image field is used. The track length (axial distance between object plane and image plane) is 1300 mm. The optical correction for aberrations is characterized by a wavefront error (RMS) equal to or smaller than 3 mλ for all image heights. All lenses are made of fused silica.

A first pupil surface P1 is formed within the first, refractive objective part ROP1 between object surface OS and first intermediate image IMI1 at a position where the chief ray CR intersects the optical axis OA. A second pupil surface P2 is present within the second, catoptric objective part COP2 between the first and second intermediate images between the concave mirrors CM1 and CM2 where the chief ray CR intersects the optical axis. A third pupil surface P3 is formed within the third, refractive objective part ROP3 where the chief ray CR intersects the optical axis a third time prior to impinging on the image surface. An aperture stop AS is positioned within the third objective part between the third and fourth lens when viewed from the image side. An upper marginal ray MRU and a lower marginal ray MRL are also indicated.

The projection objective 100 is one example for a projection objective having an object-side imaging subsystem OSIS for creating a final intermediate image closest to the image surface (identical to the second intermediate image IMI2) and a subsequent image-side imaging subsystem ISIS (identical with the second refractive objective part ROP3) for imaging the final intermediate image IMI2 directly, i.e. without further intermediate image, onto the image surface. In this particular case, the object-side imaging subsystem OSIS includes two concatenated objective parts ROP1 and COP2, wherein each of that objective parts forms an imaging subsystem. In this case, one intermediate image, namely the first intermediate image IMI1, is formed within the object-side imaging subsystem.

Figure 2:
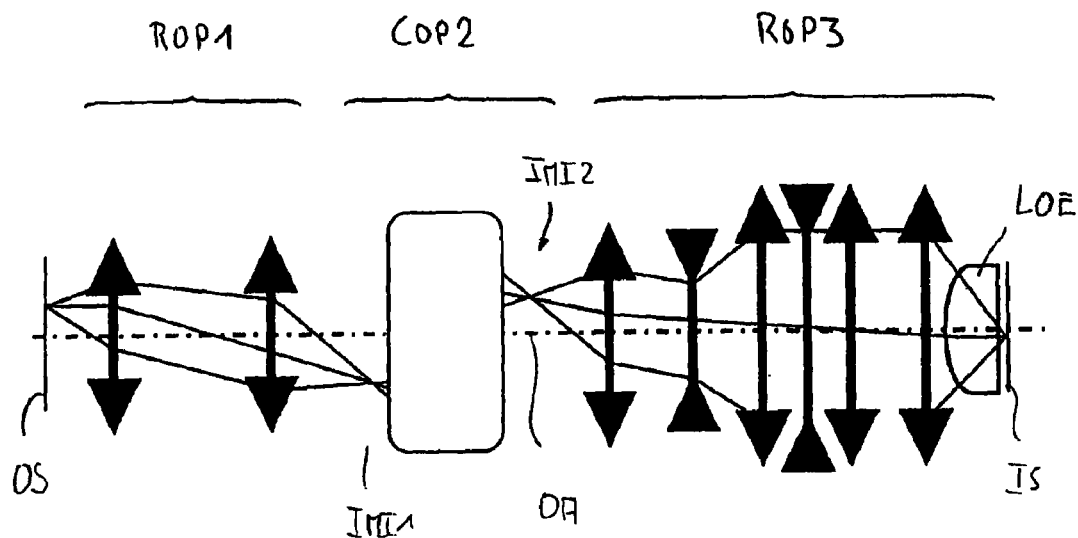
FIG. 2 is a schematic representation of refractive power distribution in the projection objective in FIG. 1.

The sequence and types of optical elements and their respective function will now be described in detail. The general sequence of lens groups and their respective refractive powers are shown schematically in FIG. 2. In this representation, lens groups with overall positive refractive power are represented by a double-arrow with arrow heads facing outside, and negative lens groups with overall negative refractive power are represented by a double-arrow having arrow heads facing inside (towards the optical axis).

The first refractive objective part ROP1 forms the first intermediate image IMI1 from radiation coming from the object field OF and is designed to define the position and quality of that first intermediate image. Some aberrations introduced by this imaging process, for example the field curvature (represented by the Petzval sum) are compensated by the subsystems downstream of the first intermediate image. Other aberrations caused by the first objective part, such as spherical aberration, correct aberrations caused by the subsequent system parts. In high aperture systems having a prescribed overall length between object surface and image surface the first objective part should be axially short, which corresponds to large refractive powers of the lenses. The first intermediate image should have a low level of asymmetric aberrations. Aspheric surfaces close to the first pupil surface P1 and optimized lens shapes may be employed for that purpose. Specifically, meniscus-shaped lenses can be used to minimize aberration contributions. Here, meniscus lenses having concave surfaces facing the pupil surface P1 appear preferable.

Figure 3:
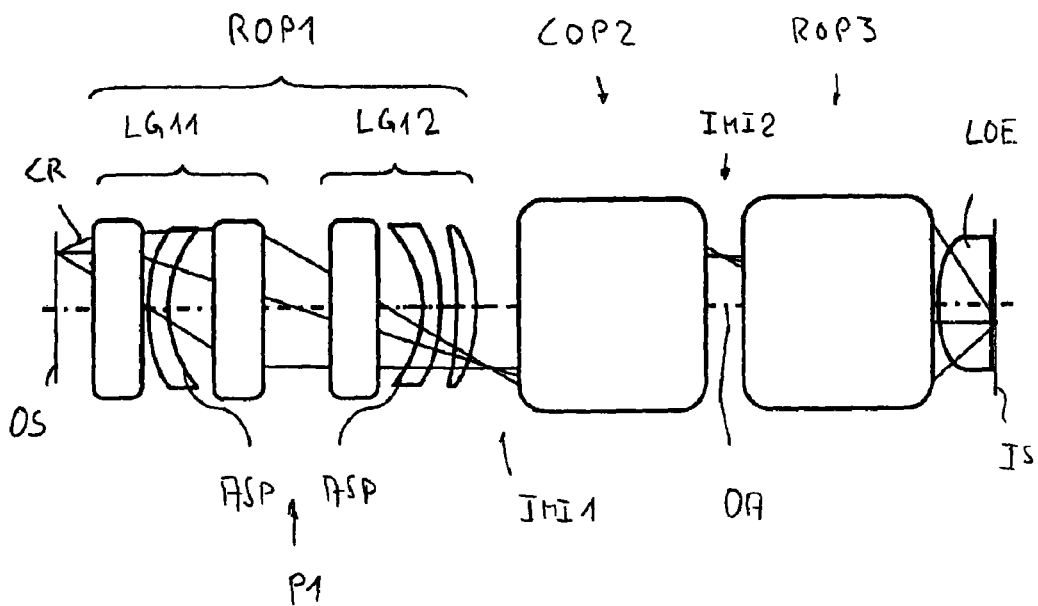
FIG. 3 is a schematic representation showing a preferred design of the first refractive objective part.

The first refractive objective part ROP1 is sub-divided into a positive lens group LG11 with overall positive refractive power between the object surface and the first pupil surface, and another positive lens group LG12 between the first pupil surface and the first intermediate image. It is preferred that at least one negative meniscus having a concave exit surface facing the pupil surface P1 is arranged between object surface and the first pupil surface. Further, at least two meniscus lenses, each having concave surfaces facing the first pupil surface, should be present between that pupil surface and the first intermediate image, where at least one has positive refractive power (lens immediately upstream of the first intermediate image) and at least one has negative refractive power. It has been found that two negative meniscus lenses upstream and downstream of the first pupil surface, respectively and both concave towards the pupil surface, may be particularly beneficial. The meniscus lens upstream of the pupil surface strongly influences coma in the first intermediate image, whereas the meniscus between pupil surface and intermediate image has a strong influence on spherical aberration of the first intermediate image. The effects can be enhanced by providing aspheric shapes ASP on these lenses, particularly on the concave surfaces. FIG. 3 shows a schematic representation of a preferred structure of the first refractive objective part ROP1.

The second catoptic objective part consists of two aspheric concave mirrors CM1 and CM2 only. The imaging subsystems ROP1 and COP2 form the object-side imaging subsystem OSIS which creates the final intermediate image (corresponding to IMI2) while forming one intermediate image IMI1. It has been found that a large angle between the upper marginal ray and the lower marginal ray at the final intermediate image is beneficial for obtaining axially compact systems. Since the magnification of the object-side imaging subsystem OSIS falls in the range from 1.75 to 2, an increase in this angle can be obtained by spherical aberration undercorrection The refractive third objective part ROP3 has a characteristic sequence of lens groups with opposite overall refractive powers. A primary positive lens group LG31 is situated immediately downstream of the second intermediate image. This is followed by a primary negative lens group LG32 formed by two negative lenses, each having an aspheric concave exit surface. A subsequent intermediate positive lens group LG33 is formed by a thin positive meniscus having an object-side concave surface and two subsequent positive lenses. A secondary negative lens group LG34 is formed by a single bispherical negative meniscus lens having a concave object-side entry surface. A final positive lens group LG35 includes five positive lenses and includes the third pupil surface P3 closest to the image surface and situated upstream of the three last positive lenses. The final positive lens group includes the last optical element LOE closest to the image surface, which is formed by a plano-convex fused silica lens.

The third, refractive imaging subsystem ROP3 has an axial length $L_{ISIS}$ substantially larger than the axial length L1 of the first objective part ROP1 (compare FIG. 4), which allows introducing a number of efficient correction means in regions having relatively large beam diameter. A favorable design includes a short positive lens group LG31 close to the final intermediate image for, "capturing" the diverging ray bundles originating from the outer field points of the final intermediate image IMI2. The subsequent primary negative lens group LG32 with strong negative refractive power is primarily designed to correct spherical aberration and coma. The subsequent positive lens group LG33 contributes to converging the divergent beam exiting the primary negative lens group LG32. The subsequent secondary negative lens group LG34 further contributes to correction of spherical aberration and coma, but in a way different from the effects of the primary negative lens group LG32. The subsequent positive lenses of the final positive lens group LG35 are designed to converge the radiation to obtain the high aperture within the last optical element LOE3 as a prerequisite for obtaining an image-side numerical aperture NA=1.35 which is close to the refractive index of the fused silica forming the last optical element ($n_{SiO2}$=1.56).

In this context it is important to note that the third, refractive subsystem includes two axially separated negative lens groups LG32 and LG34 which are separated by a positive lens group (LG33) and which are positioned in regions with significantly different beam diameter. In the region of the primary negative lens group LG32 the diameter of the beam bundles is small. The focal length $f_N$ of the negative lenses is small. Preferably $|f_N|<L/10$ where L is the axial length (track length) of the projection objective. Spherical aberration and coma are primarily corrected under these conditions. To this end, image-side concave exit surfaces with high angles of incidence are favorable. Here, MRA>arcsin (0.93) (i.e. MRA>68.4°). Those surfaces have a substantially overcorrecting effect on spherical aberration and coma. In the embodiment, both concave exit surfaces are aspheric surfaces, whereby the contributions to higher order aberrations can be adjusted. In contrast, the angles included between the marginal rays and the optical axis (i.e. the marginal ray angles) are significantly smaller in the region of the secondary negative lens group LG34, which is disposed at much larger absolute values of marginal ray heights when compared to the primary negative lens group LG32. In the embodiment, the marginal ray angles are smaller than arcsin (0.85)° at the concave entry surface of the thin negative meniscus forming LG34. Due to the difference in heights of the marginal rays and the chief ray CR the axially separated negative lens groups LG32 and LG34 have different influence on spherical aberration and coma, whereby a strong decoupling and a targeted correction of these aberrations is possible through balancing of higher and lower orders of aberrations.

In the final positive lens group LG35 adjacent to the image surface IS one or more positive meniscus lenses with concave, preferably aspheric exit surface serve to converge the beam while introducing only small contributions to spherical aberration and coma.

The shape of selected aspheric surfaces is optimized such that a contribution to lens diameter reduction is obtained. Specifically, aspheric surfaces are provided which reduce beam divergence or which enhance beam convergence at the surfaces provided with an aspheric shape. At least one aspheric lens surface arranged in a region of convergent beam is designed as a convergence-enhancing aspheric surface. Such aspheres are producing a stronger bending of the marginal ray toward the optical axis and thus reducing beam diameter downstream thereof. Theses aspheres are positioned in light beams toward small beam diameters like LG 31 and LG 35. The condition $MRA_{AS}/MRA_S>1.2$ holds in this embodiment, where $MRA_{AS}$ is a marginal ray angle immediately downstream of the aspheric lens surface and $MRA_S$ is a value for the marginal ray angle in the absence of an aspheric deformation at a corresponding spherical base lens surface. In lens groups performing strong beam bending, like LG 35, another type of asphere is present. It bends the lens surface toward an aplanatic shape without decreasing lens power. The asphere is moving the intersection point between the ray and the surface beyond the intersection point between the ray and the spherical base surface. This type of asphere has an overcorrecting effect on spherical aberration according to $MRA_S/MRA_{AS}>1.2$. In the embodiment of FIG. 1 both types of aspheres are present in the lens group between the position of minimum light beam diameter and the image surface.

Figure 4:
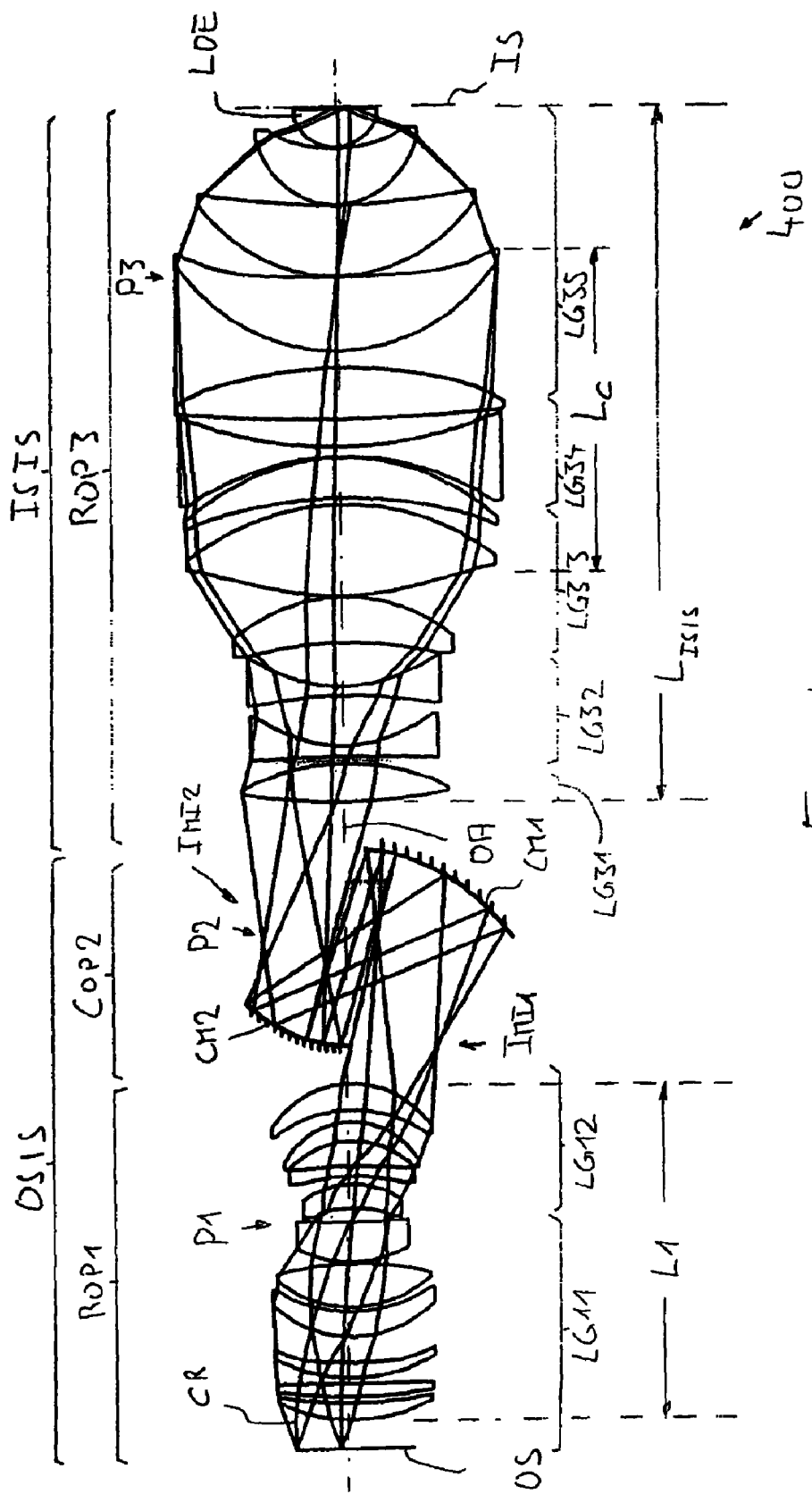
FIG. 4 is a longitudinally sectioned view of a second embodiment of a catadioptric projection objective according to the invention with NA=1.45.

FIG. 4 shows a second embodiment of a catadioptric projection objective 400 designed for immersion lithography at 193 nm. The specifications are given in Table 4 and 4A. Like in the first embodiment, all lenses are made from the same material, namely fused silica. An image-side numerical aperture NA=1.45 is obtained at an image field size 5.5 mm×26 mm if an immersion medium (here: bicyclohexyl) with refractive index $n_I=1.65$ is used within the 3 mm gap between the planar exit surface of the projection objective and the image surface.

Lenses and lens groups having essentially the same position within the optical system and essentially the same function are denoted by the same reference numerals as in FIG. 1. Comparing the embodiment for NA=1.35 in FIG. 1 and NA=1.45 in FIG. 4, allows to identify some properties useful for obtaining ultra-high NA close to the refractive index of the last optical element. The first, refractive objective part ROP1 is basically designed according to the principles shown in the schematic drawing of FIG. 2. Reference is made to the according description. Likewise, the catoptric second objective part COP2 is basically similar to that of FIG. 1. However, as the aperture increases, the intermediate images IMI1 and IMI2 appear to become more aberrated particularly with respect to coma, and it becomes more difficult to avoid beam vignetting at the edges of the concave mirrors. Like in the first embodiment, the third, refractive objective part has general construction P N P N P, where the positive group LG31 closest to the second intermediate image is formed by a single biconvex positive lens and the primary negative lens group LG32 is formed by two consecutive negative lenses having aspheric concave exit surfaces. The subsequent intermediate positive lens group LG33 formed by three consecutive positive lenses is now designed to create an essentially collimated beam entering the single, biconcave negative lens forming the secondary negative lens group LG34.

The image-side imaging subsystem ISIS includes an axially extended partial section with length $L_C$ where the beam is essentially collimated. Specifically, the maximum incidence angles do not exceed about $\pm\arcsin (0.86)°$ ($\approx 59.3°$) in this region extending from the biconvex positive lens in LG33 essentially to the third pupil surface P3. The length $L_C$ of this partial section is in the same order of magnitude as the diameter $D_{MAX}$ of the largest lenses within that imaging subsystem closest to the image surface. This feature marks a significant difference to conventional high NA systems where an image side "belly" is typically formed within the refractive imaging subsystem closest to the image surface, where a continuous change of marginal ray angles occurs as a "bulge" or a "belly" is formed.

Further, as the numerical aperture NA increases, the tendency for the positive lenses closest to the last optical element LOE to attain a meniscus shape having an image-side concave exit surface is more pronounced. Further, as NA increases, it appears to be favorable that the plano-convex last optical element LOE attains a "flat" non-hemispherical shape where the center of curvature of the spherical entry surface falls well beyond the image surface such that a small edge thickness $ET_{LOE}$ is obtained. Here, $ET_{LOE}=NA\times 6.3$ mm. This general shape allows a short and compact construction and a deflection of the marginal rays of the highly opened beam close to the image surface.

Further, it is evident that the axial length L1 of the first imaging subsystem ROP1 (measured between the entry surface of the protection objective and the exit surface of the lens closest to the first intermediate image) is significantly smaller than the axial length $L_{ISIS}$ of the image-side imaging subsystem (measured between the entry surface of that subsystem and the planar exit surface of the protection objective. Specifically, $L_{ISIS}$ may be between 1.8 times and three times as large as L1. This indicates the tendency for this type of projection objectives to form a relatively long third refractive objective part where highly efficient correction means can be distributed at different axial positions to exert varying influence on the aberrations, such as spherical aberration and coma.

Figure 5:
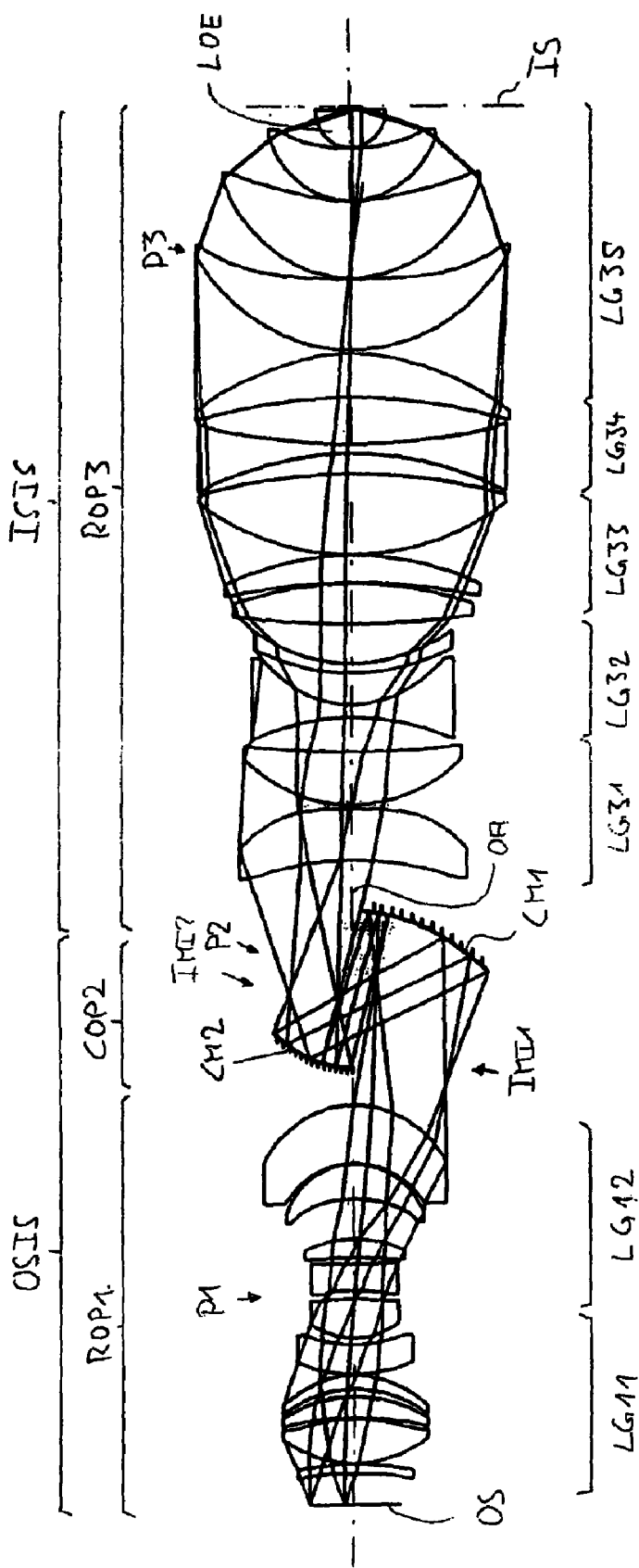
FIG. 5 is a longitudinally sectioned view of a third embodiment of a catadioptric projection objective according to the invention with NA=1.50.

The third embodiment of a projection objective 500 shown in FIG. 5 (specification in tables 5, 5A) exemplifies which significant adjustments to the basic construction of the design can be made to obtain even higher NA values. Here, NA=1.50 is obtained at 193 nm in an image field having size 4 mm×22 mm, if an immersion medium having refractive index $n_I=1.65$ is introduced in the 2.53 mm gap between the last optical element and the image surface.

A comparative view of the embodiments of FIGS. 4 and 5 reveals that a further increase of NA is facilitated by some modifications of the basic design. In the image-side imaging subsystem ISIS these modifications include an increase in diameter and refractive power of the primary positive lens group LG31, which is now formed by two consecutive positive lenses upstream of the primary negative lens group LG32. The primary negative lens group LG32 includes two consecutive negative lenses having image-side concave surfaces, where very high angles of incidence with SINIMAX=(0.966 to 0.984) occur at the concave exit surface of the thin negative meniscus lens directly preceding subsequent positive lenses of the intermediate positive lens group LG33. The secondary negative lens group following thereon is formed by a single biconcave negative lens arranged at a position where the maximum beam height is at least 90% of the maximum beam height within the image-side imaging subsystem. Like in the third embodiment, three consecutive positive lenses closest to the last optical element LOE are formed by positive meniscus lenses having concave exit surfaces. As NA increases, the radius of curvature of the entry side of the last optical element is shortened and the edge thickness ET is further reduced. Here, ET=4×NA.

Figure 6:
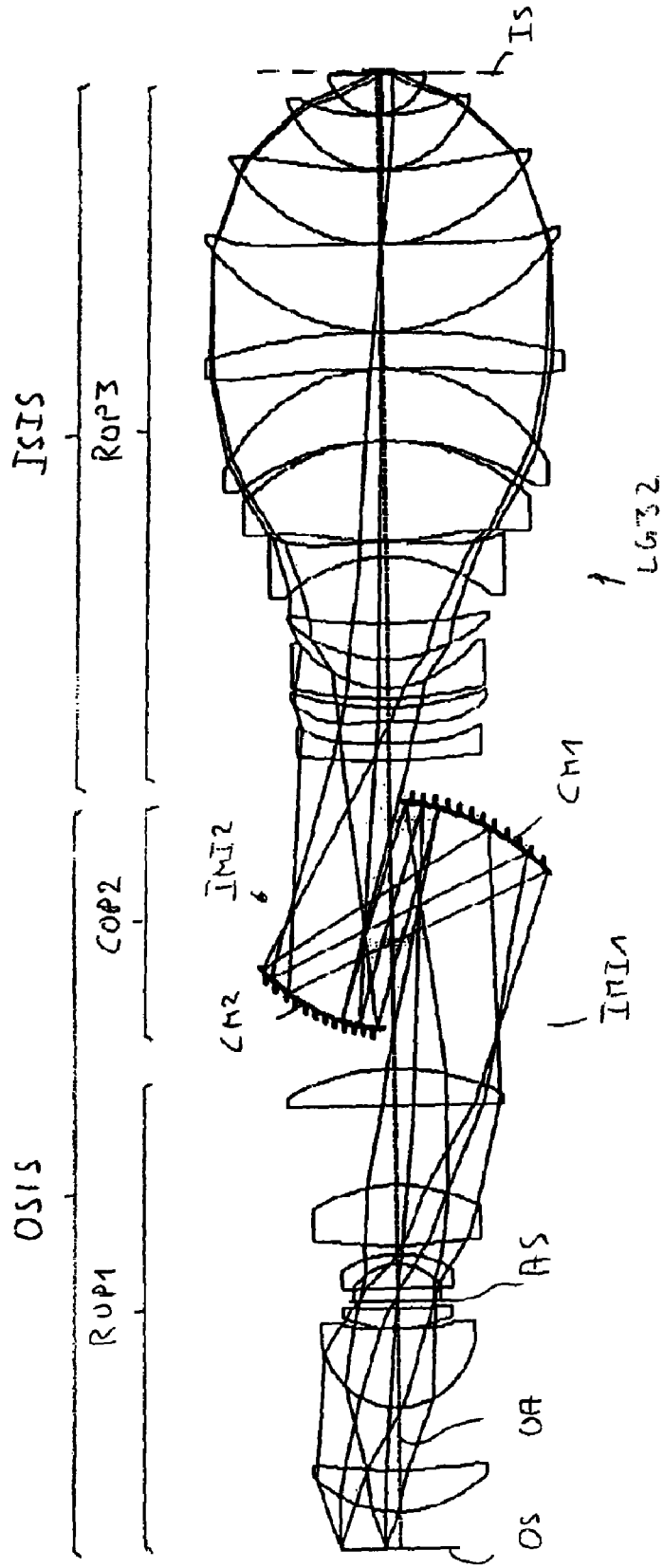
FIG. 6 is a longitudinally sectioned view of a fourth embodiment of a catadioptric projection objective with NA 1.43.

The fourth embodiment in FIG. 6 shows a catadioptric system designed for immersion lithography at 193 nm. The second negative lens group LG32 is positioned in a region with increasing beam diameters. The aperture stop AS is positioned in the front objective part.

Figure 7:
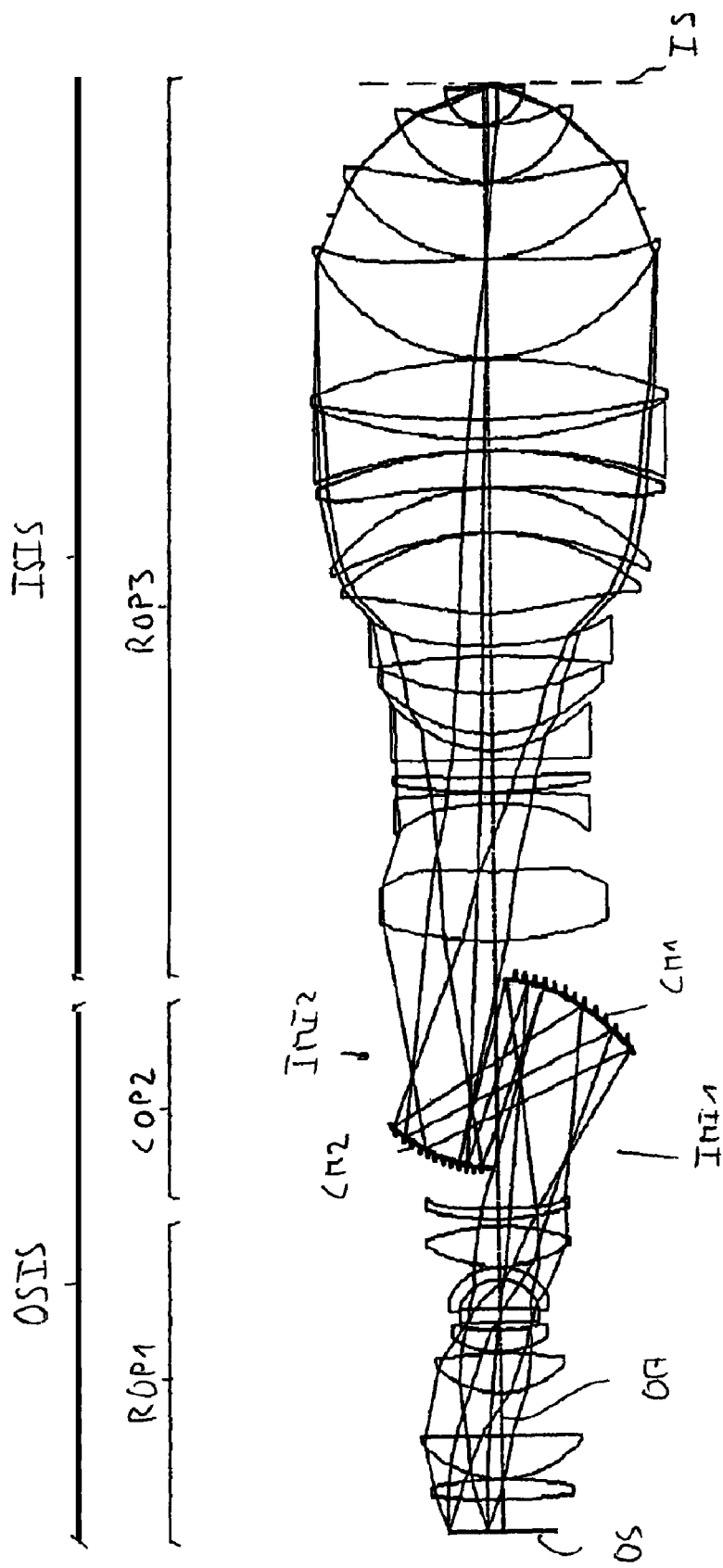
FIG. 7 is a longitudinally sectioned view of a fifth embodiment of a catadioptric projection objective with NA 1.40.

The fifth embodiment in FIG. 7 shows a catadioptric system designed for immersion lithography at 248 nm.

In FIGS. 6 and 7, lens groups having similar position within the optical system and similar function are denoted by the same reference numerals as in FIG. 1. The specifications are given in Tables 6, 6A and 7, 7A, respectively.

The exemplary embodiment discussed above is a catadioptric projection objective with exactly two concave mirrors, exactly two intermediate images and three pupil surfaces, where all optical elements are aligned along one straight, unfolded optical axis. Implementation of the invention is not restricted to this type of projection objectives. The invention can also be incorporated into projection objectives having only one concave mirror, or catadioptric projection objectives having two concave mirrors in a arrangement different from that shown in the figures, or in embodiments having more than two concave mirrors. Also, use of the invention can be made independent of whether or not folding mirrors are present in the optical design. Further, the invention can be used in catadioptric system having off-axis field (such as exemplarily shown here) or in systems having an axial field (typically centered around the optical axis). The latter type may have a physical beam splitter, such as a polarization selective beam splitter, or may be designed as a system having a central pupil obscuration. Examples of catadioptric systems suitable for incorporation of the invention are given e.g. in applicants U.S. applications having Ser. Nos. 60/511,673 (corresponding to WO 2005/040890), 60/560,267 or in US 2002/0012100 A1. The disclosure of these documents is incorporated herein by reference. Other examples are shown in US 2003/0011755 A1 and related applications or in WO 2004/107011A1. The invention may also be incorporated into a purely refractive projection objective.

The invention can be implemented into projection objectives with any suitable number of intermediate images depending on demand.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The contents of all the claims is made part of this description by reference.

TABLE 1

(NA = 1.35, Field 26 mm × 5.5 mm, λ = 193.368 nm)

| SURF | RADIUS | | THICKNESS | MATERIAL | 193.368 nm | SEMIDAM. |
|---|---|---|---|---|---|---|
| 0 | 0.000000 | | 0.000000 | AIR | 1.00000000 | 63.000 |
| 1 | 0.000000 | | −0.045926 | AIR | 1.00000000 | 63.000 |
| 2 | 588.974966 | AS | 10.014054 | SIO2V | 1.56078570 | 75.092 |
| 3 | 605.303100 | | 1.028802 | AIR | 1.00000000 | 76.533 |
| 4 | 149.734335 | | 28.845794 | SIO2V | 1.56078570 | 84.291 |
| 5 | 895.399648 | | 14.407945 | AIR | 1.00000000 | 83.906 |
| 6 | 160.211676 | | 9.997034 | SIO2V | 1.56078570 | 82.721 |
| 7 | 163.190100 | AS | 19.398779 | AIR | 1.00000000 | 79.264 |
| 8 | 123.800631 | | 72.703585 | SIO2V | 1.56078570 | 81.434 |
| 9 | −218.004976 | AS | 0.997015 | AIR | 1.00000000 | 72.904 |
| 10 | 410.389549 | | 31.610871 | SIO2V | 1.56078570 | 68.934 |
| 11 | −218.415249 | | 9.198552 | AIR | 1.00000000 | 64.830 |
| 12 | 232.842016 | | 14.096505 | SIO2V | 1.56078570 | 46.400 |
| 13 | 218.253326 | AS | 17.708694 | AIR | 1.00000000 | 41.425 |
| 14 | 371.376172 | AS | 30.198397 | SIO2V | 1.56078570 | 41.242 |
| 15 | −131.889329 | | 0.982312 | AIR | 1.00000000 | 50.189 |
| 16 | −192.050690 | AS | 10.672777 | SIO2V | 1.56078570 | 51.647 |
| 17 | 6880.347608 | | 38.901682 | AIR | 1.00000000 | 56.908 |
| 18 | −63.153786 | | 9.952071 | SIO2V | 1.56078570 | 57.614 |
| 19 | −76.163992 | | 4.185363 | AIR | 1.00000000 | 65.945 |
| 20 | −294.066736 | | 38.080573 | SIO2V | 1.56078570 | 84.293 |
| 21 | −107.879338 | | 40.117737 | AIR | 1.00000000 | 87.238 |
| 22 | 0.000000 | | 211.840224 | AIR | 1.00000000 | 101.021 |
| 23 | −186.865174 | AS | −211.840224 | REFL | 1.00000000 | 169.082 |
| 24 | 163.273909 | AS | 11.840224 | REFL | 1.00000000 | 126.127 |
| 25 | 0.000000 | | 49.996750 | AIR | 1.00000000 | 107.084 |
| 26 | 244.235465 | | 51.384846 | SIO2V | 1.56078570 | 111.979 |
| 27 | −357.539683 | | 21.862201 | AIR | 1.00000000 | 111.055 |
| 28 | −720.560682 | | 10.186639 | SIO2V | 1.56078570 | 95.285 |
| 29 | 154.739841 | AS | 38.479821 | AIR | 1.00000000 | 85.942 |
| 30 | 1364.026970 | | 10.127676 | SIO2V | 1.56078570 | 85.690 |
| 31 | 105.927141 | AS | 68.810209 | AIR | 1.00000000 | 84.350 |
| 32 | −230.773982 | | 16.236415 | SIO2V | 1.56078570 | 93.089 |
| 33 | −178.790716 | AS | 14.629629 | AIR | 1.00000000 | 97.701 |
| 34 | 272.927359 | AS | 38.595919 | SIO2V | 1.56078570 | 131.946 |
| 35 | −5625.239030 | | 5.138831 | AIR | 1.00000000 | 132.988 |
| 36 | −1387.012750 | AS | 40.033826 | SIO2V | 1.56078570 | 133.706 |
| 37 | −282.422607 | | 33.813237 | AIR | 1.00000000 | 134.856 |
| 38 | −172.027610 | | 10.093699 | SIO2V | 1.56078570 | 134.562 |
| 39 | −221.057520 | | 1.187027 | AIR | 1.00000000 | 142.493 |
| 40 | −2385.048673 | | 17.320569 | SIO2V | 1.56078570 | 147.675 |
| 41 | −693.202817 | AS | 4.155300 | AIR | 1.00000000 | 148.474 |
| 42 | 238.012618 | | 49.285476 | SIO2V | 1.56078570 | 146.861 |
| 43 | −2063.011772 | AS | 33.407706 | AIR | 1.00000000 | 143.994 |
| 44 | 0.000000 | | 0.000000 | AIR | 1.00000000 | 140.412 |
| 45 | 0.000000 | | −32.415500 | AIR | 1.00000000 | 140.412 |
| 46 | 198.312466 | | 73.247236 | SIO2V | 1.56078570 | 139.427 |
| 47 | −4329.369887 | AS | 0.829628 | AIR | 1.00000000 | 136.429 |
| 48 | 103.664602 | | 48.842802 | SIO2V | 1.56078570 | 91.197 |
| 49 | 388.273716 | AS | 0.841315 | AIR | 1.00000000 | 82.598 |
| 50 | 57.855394 | | 48.394204 | SIO2V | 1.56078570 | 51.857 |
| 51 | 0.000000 | | 2.785500 | H2O | 1.43667693 | 23.607 |
| 52 | 0.000000 | | 0.000000 | AIR | 0.00000000 | 15.750 |

TABLE 1A

Aspheric constants

| SRF | 2 | 7 | 9 | 13 | 14 | 16 |
|---|---|---|---|---|---|---|
| K | 0 | 0 | 0 | 0 | 0 | 0 |
| C1 | 1.195420e−07 | 2.403080e−07 | 1.617771e−07 | −2.423666e−07 | −6.400592e−07 | 5.751806e−08 |
| C2 | −1.312059e−11 | −3.729336e−12 | 2.423435e−13 | −2.124191e−11 | −8.070571e−11 | 2.774569e−11 |
| C3 | −2.883257e−16 | −6.598338e−16 | 3.276770e−15 | 1.812002e−14 | 1.502497e−16 | −5.161774e−15 |
| C4 | 3.725511e−20 | 1.311312e−19 | −4.890531e−19 | −1.412435e−17 | 1.423703e−20 | −1.084286e−18 |
| C5 | 4.818548e−25 | −4.822084e−23 | 9.364141e−23 | −5.823140e−22 | 1.792882e−21 | −1.668535e−22 |
| C6 | 4.377201e−31 | 5.410216e−27 | −9.479096e−27 | 4.832401e−24 | −1.933826e−24 | 1.327723e−25 |
| C7 | −3.459760e−32 | −1.838513e−31 | 5.978489e−31 | −1.395724e−27 | 5.423134e−28 | −1.727876e−29 |
| C8 | 0.000000e+00 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 | 0.000000e+00 |

| SRF | 23 | 24 | 29 | 31 | 33 | 34 |
|---|---|---|---|---|---|---|
| K | −1.57881 | −1.38136 | 0 | 0 | 0 | 0 |
| C1 | −2.133535e−08 | 2.811422e−08 | −4.963344e−08 | −6.913740e−08 | 1.988186e−08 | −1.865233e−08 |
| C2 | 1.676817e−14 | 1.103273e−13 | 2.279371e−12 | −8.512661e−12 | 5.861846e−13 | 1.669585e−15 |
| C3 | −1.378102e−18 | 3.431173e−18 | 2.362530e−16 | −5.667180e−16 | 2.036213e−20 | −2.905676e−22 |
| C4 | −1.437789e−25 | −6.174719e−23 | −3.820578e−20 | 2.685131e−20 | −1.076030e−22 | 1.332228e−21 |
| C5 | 1.881123e−30 | 5.170458e−27 | 1.304143e−24 | 4.039567e−24 | −1.110072e−25 | −1.017703e−25 |
| C6 | −8.189272e−34 | −1.354252e−31 | 1.691584e−28 | −9.965833e−28 | −4.329097e−30 | 2.811735e−30 |
| C7 | 5.561918e−42 | 1.061374e−41 | −1.120450e−33 | 1.425895e−32 | −3.021518e−33 | −4.987467e−35 |
| C8 | 0.000000e+00 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 | 0.000000e+00 |

| SRF | 36 | 41 | 43 | 47 | 49 |
|---|---|---|---|---|---|
| K | 0 | 0 | 0 | 0 | 0 |
| C1 | 2.367802e−08 | 2.964388e−08 | 1.140463e−08 | −3.090849e−08 | 1.222189e−07 |
| C2 | −2.990521e−13 | −6.989145e−13 | 2.049404e−12 | 7.530989e−13 | −3.344247e−12 |
| C3 | −2.591053e−17 | −2.792249e−17 | −4.991544e−17 | 4.050319e−17 | 3.926015e−16 |
| C4 | −1.141246e−24 | 2.211101e−22 | 1.189104e−21 | −3.590964e−21 | −6.671768e−20 |
| C5 | −1.715913e−27 | 2.027295e−26 | −4.292284e−26 | 1.352780e−25 | 9.981205e−24 |
| C6 | 1.161597e−30 | −3.078600e−31 | 1.593127e−30 | −2.698224e−30 | −8.282862e−28 |
| C7 | −1.171950e−35 | 1.009169e−37 | −2.827659e−35 | 2.348243e−35 | 3.733718e−32 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

TABLE 4

(NA = 1.45, Field 26 mm × 5.5 mm, λ = 193.368 nm)

| SURFACE | RADIUS | | THICKNESS | MATERIAL | 193.368 nm | SEMIDIAM. |
|---|---|---|---|---|---|---|
| 0 | 0.000000 | | 0.000000 | AIR | 1.00000000 | 64.000 |
| 1 | 0.000000 | | 29.992229 | AIR | 1.00000000 | 64.000 |
| 2 | 233.631982 | AS | 17.551206 | SIO2V | 1.56078570 | 83.071 |
| 3 | 507.266109 | | 5.918975 | AIR | 1.00000000 | 83.280 |
| 4 | 547.984402 | | 13.770635 | SIO2V | 1.56078570 | 84.167 |
| 5 | 4798.299454 | | 5.794270 | AIR | 1.00000000 | 84.523 |
| 6 | 182.315368 | | 15.957107 | SIO2V | 1.56078570 | 86.665 |
| 7 | 1094.670591 | AS | 26.236583 | AIR | 1.00000000 | 85.494 |
| 8 | 126.978567 | | 26.250916 | SIO2V | 1.56078570 | 87.419 |
| 9 | 148.073166 | AS | 4.366211 | AIR | 1.00000000 | 82.832 |
| 10 | 127.089829 | | 46.156963 | SIO2V | 1.56078570 | 82.836 |
| 11 | −328.527648 | | 1.443537 | AIR | 1.00000000 | 81.340 |
| 12 | 125.382993 | | 42.244457 | SIO2V | 1.56078570 | 60.380 |
| 13 | −4690.236416 | AS | 13.870859 | AIR | 1.00000000 | 41.235 |
| 14 | −230.486163 | AS | 25.229633 | SIO2V | 1.56078570 | 41.648 |
| 15 | −96.179553 | | 8.277618 | AIR | 1.00000000 | 52.550 |
| 16 | −185.785290 | AS | 9.956545 | SIO2V | 1.56078570 | 62.109 |
| 17 | −866.055513 | | 26.373160 | AIR | 1.00000000 | 67.668 |
| 18 | −90.627766 | AS | 19.672286 | SIO2V | 1.56078570 | 68.225 |
| 19 | −85.368379 | | 12.282164 | AIR | 1.00000000 | 72.966 |
| 20 | −146.565252 | | 27.788873 | SIO2V | 1.56078570 | 83.165 |
| 21 | −105.505466 | | 39.964832 | AIR | 1.00000000 | 86.950 |
| 22 | 0.000000 | | 208.058461 | AIR | 1.00000000 | 108.975 |

TABLE 4-continued (NA = 1.45, Field 26 mm × 5.5 mm, λ = 193.368 nm)

| SURFACE | RADIUS | | THICKNESS | MATERIAL | 193.368 nm | SEMIDIAM. |
|---|---|---|---|---|---|---|
| 23 | −191.636574 | AS | −208.058461 | REFL | 1.00000000 | 178.929 |
| 24 | 148.527408 | AS | 208.058461 | REFL | 1.00000000 | 111.619 |
| 25 | 0.000000 | | 49.479139 | AIR | 1.00000000 | 105.326 |
| 26 | 655.023529 | | 39.233869 | SIO2V | 1.56078570 | 111.832 |
| 27 | −265.619907 | AS | 7.789428 | AIR | 1.00000000 | 111.871 |
| 28 | −2115.070886 | | 11.499768 | SIO2V | 1.56078570 | 102.205 |
| 29 | 147.775459 | AS | 52.393786 | AIR | 1.00000000 | 94.534 |
| 30 | −517.157315 | | 9.987031 | SIO2V | 1.56078570 | 96.231 |
| 31 | 166.411920 | AS | 46.131550 | AIR | 1.00000000 | 104.419 |
| 32 | −431.323962 | | 48.495926 | SIO2V | 1.56078570 | 105.222 |
| 33 | −189.275235 | AS | 1.300468 | AIR | 1.00000000 | 118.897 |
| 34 | 331.384906 | AS | 94.546283 | SIO2V | 1.56078570 | 163.359 |
| 35 | −280.649352 | | 7.091843 | AIR | 1.00000000 | 166.407 |
| 36 | −477.881436 | AS | 41.173726 | SIO2V | 1.56078570 | 167.842 |
| 37 | −257.027733 | | 1.137850 | AIR | 1.00000000 | 169.323 |
| 38 | −312.423289 | | 10.022660 | SIO2V | 1.56078570 | 165.501 |
| 39 | 471.168311 | | 28.813629 | AIR | 1.00000000 | 174.004 |
| 40 | 1966.630050 | | 52.577809 | SIO2V | 1.56078570 | 175.460 |
| 41 | −480.571099 | AS | 18.082850 | AIR | 1.00000000 | 177.291 |
| 42 | 209.738474 | | 77.495791 | SIO2V | 1.56078570 | 175.558 |
| 43 | 1349.877454 | AS | 75.451090 | AIR | 1.00000000 | 171.545 |
| 44 | 0.000000 | | 0.000000 | AIR | 1.00000000 | 151.074 |
| 45 | 0.000000 | | −74.483474 | AIR | 1.00000000 | 151.074 |
| 46 | 184.351006 | | 73.464222 | SIO2V | 1.56078570 | 150.159 |
| 47 | 521.484557 | AS | 0.893514 | AIR | 1.00000000 | 144.645 |
| 48 | 89.885837 | | 57.500869 | SIO2V | 1.56078570 | 87.367 |
| 49 | 202.314704 | AS | 0.906101 | AIR | 1.00000000 | 74.351 |
| 50 | 49.487512 | | 38.895422 | SIO2V | 1.56078570 | 45.285 |
| 51 | 0.000000 | | 3.000000 | bicyclohexyl | 1.65000000 | 21.555 |
| 52 | 0.000000 | | 0.000000 | AIR | 0.00000000 | 16.001 |

TABLE 4A

Aspheric constants

| | SRF | | | | |
|---|---|---|---|---|---|
| | 2 | 7 | 9 | 13 | 14 |
| K  | 0 | 0 | 0 | 0 | 0 |
| C1 | 1.494264e−07 | 2.359247e−07 | −1.388705e−07 | 5.121278e−07 | −9.845030e−07 |
| C2 | −7.264483e−12 | 1.630350e−15 | 6.684785e−12 | −1.963778e−11 | −1.786479e−10 |
| C3 | −3.664731e−16 | 1.168737e−16 | −1.564902e−17 | −4.600546e−16 | −4.468994e−14 |
| C4 | 9.721428e−22 | −7.934006e−20 | 5.980056e−19 | −2.537090e−18 | −1.711022e−17 |
| C5 | 3.007968e−24 | −4.384995e−24 | −7.556744e−23 | −3.655860e−22 | 1.006638e−21 |
| C6 | −3.615393e−28 | 1.154685e−29 | 3.147511e−27 | 2.423415e−25 | −3.056779e−24 |
| C7 | 1.733464e−33 | 3.862589e−32 | 2.185286e−32 | −7.898199e−29 | −3.652497e−29 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 16 | 18 | 23 | 24 | 27 |
| K  | 0 | 0 | −1.59135 | −1.72236 | 0 |
| C1 | −3.159634e−09 | 6.882459e−08 | −2.104789e−08 | 5.009626e−08 | 5.903616e−09 |
| C2 | 8.744472e−11 | 1.205629e−11 | −3.913935e−16 | −1.706367e−13 | −1.667157e−12 |
| C3 | −3.661402e−15 | 9.801269e−16 | −1.615007e−18 | 1.273365e−17 | 1.202734e−16 |
| C4 | −3.184022e−20 | 2.209566e−20 | −4.451286e−24 | −9.616900e−23 | −6.692382e−21 |
| C5 | −7.210239e−22 | 3.673565e−24 | −3.687968e−30 | −7.757562e−27 | −7.634164e−27 |
| C6 | 1.763872e−25 | −7.351070e−27 | −4.479534e−33 | 6.954568e−31 | 1.759042e−29 |
| C7 | −1.257955e−29 | −4.291630e−32 | 1.851611e−38 | −1.619857e−35 | −5.023956e−34 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 29 | 31 | 33 | 34 | 36 |
| K  | 0 | 0 | 0 | 0 | 0 |
| C1 | −3.558574e−08 | −1.806251e−08 | 4.920126e−09 | −1.525673e−08 | 7.499687e−09 |
| C2 | −4.932541e−15 | −3.090098e−13 | −7.235293e−14 | −2.067050e−13 | −2.119058e−13 |

TABLE 4A-continued

Aspheric constants

| | | | | | |
|---|---|---|---|---|---|
| C3 | 5.670677e−17 | −1.480226e−16 | −2.940727e−18 | −4.302039e−19 | −4.990024e−18 |
| C4 | −1.026477e−20 | 7.742992e−22 | −8.315048e−22 | 2.471642e−22 | 2.052922e−22 |
| C5 | −6.265149e−25 | −2.341984e−25 | 1.283994e−25 | −6.807112e−27 | −1.290369e−26 |
| C6 | 2.406234e−28 | 2.402813e−29 | −8.650284e−30 | −3.031401e−34 | 3.074909e−31 |
| C7 | −1.040952e−32 | −1.730751e−34 | 3.268677e−34 | −4.214445e−38 | 2.529991e−37 |
| C8 | .000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | |
|---|---|---|---|---|
| | 41 | 43 | 47 | 49 |
| K | 0 | 0 | 0 | 0 |
| C1 | 1.374901e−08 | −7.461833e−09 | −3.155561e−08 | 1.454382e−07 |
| C2 | −3.521698e−13 | 1.801406e−12 | 1.066867e−13 | 6.313219e−12 |
| C3 | −7.030349e−18 | −4.9223266e−17 | 6.217228e−17 | −5.217767e−16 |
| C4 | −5.444870e−23 | 8.553853e−22 | −2.377982e−21 | 1.034659e−19 |
| C5 | 4.755525e−27 | −1.000912e−26 | 3.653414e−26 | −2.602441e−26 |
| C6 | −8.867235e−33 | 3.902554e−33 | −1.317262e−31 | −8.095497e−28 |
| C7 | −1.236482e−36 | 5.203653e−37 | 1.515060e−37 | 1.260489e−31 |
| C8 | 0.000000e+00 | 0.000000e+00 | 0.000000e+00 | 0.000000e+00 |
| C9 | 0.000000e+00 | 0.000000e+00 | 0.000000e+00 | 0.000000e+00 |

TABLE 5

(NA = 1.50, Field 22 mm × 4 mm, λ = 193.368 nm)

| SURF | RADIUS | | THICKNESS | MATERIAL | 193.368 nm | SEMIDIAM. |
|---|---|---|---|---|---|---|
| 0 | 0.000000 | | 0.000000 | AIR | 1.00000000 | 51.750 |
| 1 | 0.000000 | | 32.032349 | AIR | 1.00000000 | 51.750 |
| 2 | −845.212793 | AS | 9.989349 | SIO2V | 1.56078570 | 62.413 |
| 3 | −359.228232 | | 0.994285 | AIR | 1.00000000 | 65.977 |
| 4 | 142.536339 | | 47.011940 | SIO2V | 1.56078570 | 81.991 |
| 5 | −176.453262 | AS | 0.987138 | AIR | 1.00000000 | 81.827 |
| 6 | −369.268093 | | 22.318648 | SIO2V | 1.56078570 | 81.727 |
| 7 | −161.851827 | | 7.927226 | AIR | 1.00000000 | 82.311 |
| 8 | −140.452118 | | 14.741703 | SIO2V | 1.56078570 | 81.139 |
| 9 | −107.922984 | AS | 1.003150 | AIR | 1.00000000 | 82.102 |
| 10 | 174.484993 | | 30.980913 | SIO2V | 1.56078570 | 65.497 |
| 11 | 161.045742 | | 7.010468 | AIR | 1.00000000 | 54.902 |
| 12 | 87.951118 | | 41.763141 | SIO2V | 1.56078570 | 49.879 |
| 13 | −431.008087 | AS | 8.926684 | AIR | 1.00000000 | 38.107 |
| 14 | −1843.170016 | AS | 27.890386 | SIO2V | 1.56078570 | 35.498 |
| 15 | 1296.701564 | | 6.850739 | AIR | 1.00000000 | 49.007 |
| 16 | −1875.702123 | AS | 20.693377 | SIO2V | 1.56078570 | 52.181 |
| 17 | −131.885668 | | 43.233826 | AIR | 1.00000000 | 56.934 |
| 18 | −152.308249 | AS | 38.383412 | SIO2V | 1.56078570 | 72.302 |
| 19 | −83.655174 | | 1.005726 | AIR | 1.00000000 | 78.451 |
| 20 | −93.035929 | | 63.648010 | SIO2V | 1.56078570 | 79.480 |
| 21 | −116.567417 | | 39.994855 | AIR | 1.00000000 | 103.437 |
| 22 | 0.000000 | | 171.346104 | AIR | 1.00000000 | 112.255 |
| 23 | −179.735772 | AS | −171.346104 | REFL | 1.00000000 | 152.179 |
| 24 | 123.282750 | AS | 171.346104 | REFL | 1.00000000 | 92.111 |
| 25 | 0.000000 | | 54.607321 | AIR | 1.00000000 | 105.761 |
| 26 | −359.682080 | | 55.683839 | SIO2V | 1.56078570 | 117.779 |
| 27 | −918.663921 | AS | 4.020959 | AIR | 1.00000000 | 128.666 |
| 28 | 176.865788 | | 58.028421 | SIO2V | 1.56078570 | 123.348 |
| 29 | 1203.558355 | | 36.710053 | AIR | 1.00000000 | 118.527 |
| 30 | −294.120951 | | 14.230382 | SIO2V | 1.56078570 | 114.603 |
| 31 | 134.074784 | | 34.247837 | AIR | 1.00000000 | 104.576 |
| 32 | 254.474960 | | 10.212069 | SIO2V | 1.56078570 | 110.089 |
| 33 | 194.571882 | AS | 42.814034 | AIR | 1.00000000 | 112.395 |
| 34 | 727.066516 | AS | 44.057414 | SIO2V | 1.56078570 | 129.312 |
| 35 | −433.209205 | | 0.980251 | AIR | 1.00000000 | 135.236 |
| 36 | −684.318772 | | 29.887302 | SIO2V | 1.56078570 | 139.250 |
| 37 | −342.532746 | | 0.986179 | AIR | 1.00000000 | 143.961 |
| 38 | 344.015967 | AS | 85.605324 | SIO2V | 1.56078570 | 172.814 |
| 39 | −678.349763 | | 22.272127 | AIR | 1.00000000 | 172.262 |
| 40 | −382.021020 | | 9.994412 | SIO2V | 1.56078570 | 171.231 |
| 41 | 611.116224 | AS | 49.747779 | AIR | 1.00000000 | 173.378 |
| 42 | −650.891224 | | 48.373963 | SIO2V | 1.56078570 | 174.511 |
| 43 | −220.034518 | AS | 3.857322 | AIR | 1.00000000 | 177.044 |
| 44 | 205.637571 | | 75.102829 | SIO2V | 1.56078570 | 177.296 |

TABLE 5-continued (NA = 1.50, Field 22 mm × 4 mm, λ = 193.368 nm)

| SURF | RADIUS | | THICKNESS | MATERIAL | 193.368 nm | SEMIDIAM. |
|---|---|---|---|---|---|---|
| 45 | 1460.464043 | AS | 100.185035 | AIR | 1.00000000 | 172.969 |
| 46 | 0.000000 | | 0.000000 | AIR | 1.00000000 | 146.439 |
| 47 | 0.000000 | | −99.275151 | AIR | 1.00000000 | 146.439 |
| 48 | 154.672057 | | 80.650275 | SIO2V | 1.56078570 | 145.484 |
| 49 | 181.797021 | AS | 0.753902 | AIR | 1.00000000 | 138.292 |
| 50 | 101.627904 | | 54.638389 | SIO2V | 1.56078570 | 95.299 |
| 51 | 213.429642 | AS | 0.764523 | AIR | 1.00000000 | 83.098 |
| 52 | 40.937107 | | 39.599978 | SIO2V | 1.56078570 | 40.247 |
| 53 | 0.000000 | | 2.531250 | bicyclohexyl | 1.65000000 | 18.502 |
| 54 | 0.000000 | | 0.000000 | AIR | 0.00000000 | 12.938 |

TABLE 5A

Aspheric constants

| | SRF | | | | |
|---|---|---|---|---|---|
| | 2 | 5 | 9 | 13 | 14 |
| K | 0 | 0 | 0 | 0 | 0 |
| C1 | −1.599405e−07 | 1.086670e−07 | 1.337750e−07 | −4.535341e−07 | −1.820962e−06 |
| C2 | −1.692921e−11 | −1.739419e−12 | −1.372928e−14 | 2.517381e−10 | −2.451193e−10 |
| C3 | −2.324226e−15 | 2.301122e−15 | −1.500689e−15 | −1.099665e−13 | −3.314686e−14 |
| C4 | 9.069166e−19 | −2.093950e−20 | 6.194603e−19 | −4.310700e−20 | −2.629131e−17 |
| C5 | −2.417200e−22 | −4.757963e−25 | −9.762634e−23 | 2.157280e−20 | 5.109754e−29 |
| C6 | 4.766187e−26 | −2.863191e−27 | 7.946043e−27 | −5.206988e−24 | −2.349758e−24 |
| C7 | −1.984426e−30 | 2.699005e−31 | −2.678257e−31 | −1.915558e−28 | 1.410646e−26 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 16 | 18 | 23 | 24 | 27 |
| K | 0 | 0 | −2.11947 | −1.69835 | 0 |
| C1 | −6.293168e−07 | −1.156780e−07 | −3.001398e−08 | 8.403638e−08 | −1.545269e−07 |
| C2 | 3.565066e−10 | −1.492296e−11 | 3.939549e−13 | −3.822694e−13 | 2.245415e−12 |
| C3 | −9.261848e−14 | −1.067350e−15 | −9.317884e−18 | 4.891064e−17 | 3.488657e−19 |
| C4 | 1.894196e−17 | −1.542031e−19 | 2.024107e−22 | −7.573611e−22 | −3.743027e−21 |
| C5 | −7.243692e−21 | 8.241230e−24 | −4.135314e−27 | 3.472610e−27 | 1.060681e−25 |
| C6 | 1.941361e−24 | −3.956524e−27 | 4.397110e−32 | 4.265738e−30 | −3.746007e−31 |
| C7 | −2.253405e−28 | 2.240073e−34 | 3.097453e−39 | 1.743565e−40 | −4.421735e−35 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 31 | 33 | 34 | 38 | 41 |
| K | 0 | 0 | 0 | 0 | 0 |
| C1 | 5.403679e−08 | −1.839703e−09 | −4.565464e−08 | 1.985758e−08 | −1.749960e−08 |
| C2 | −2.910278e−13 | 1.837295e−12 | 2.725870e−12 | −4.718699e−13 | 2.553421e−13 |
| C3 | −4.982540e−16 | −1.205300e−16 | −9.258015e−18 | −1.592131e−17 | 3.392801e−19 |
| C4 | 3.112908e−21 | −3.706472e−24 | −2.295954e−21 | 1.881076e−21 | 7.033871e−22 |
| C5 | 1.444496e−26 | −6.567372e−25 | 2.954492e−26 | −7.053502e−26 | −1.674676e−26 |
| C6 | 3.046769e−29 | 4.732192e−29 | −2.247942e−32 | 1.315589e−30 | −2.999416e−32 |
| C7 | −1.913417e−33 | −5.655935e−34 | −6.956411e−37 | −1.132259e−35 | 1.767073e−36 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | SRF | | | |
|---|---|---|---|---|
| | 43 | 45 | 49 | 51 |
| K | 0 | 0 | 0 | 0 |
| C1 | 3.371060e−08 | 1.196936e−08 | −2.460335e−07 | −3.383738e−08 |
| C2 | −3.188018e−13 | 1.321178e−12 | 2.028362e−11 | 1.412723e−11 |
| C3 | 1.011103e−17 | −2.672101e−17 | −1.263913e−15 | −1.065908e−16 |
| C4 | −5.733398e−22 | −2.157512e−23 | 5.345289e−20 | −2.357383e−20 |
| C5 | 1.5983026e−26 | 2.325864e−28 | −1.487164e−24 | 9.208010e−26 |
| C6 | −1.086296e−31 | 5.110806e−33 | 2.436384e−29 | 1.004275e−27 |
| C7 | −1.593224e−36 | 7.866196e−37 | −1.837164e−34 | −6.877671e−32 |

TABLE 5A-continued

| | Aspheric constants | | | |
|---|---|---|---|---|
| C8 | 0.000000e+00 | 0.000000e+00 | 0.000000e+00 | 0.000000e+00 |
| C9 | 0.000000e+00 | 0.000000e+00 | 0.000000e+00 | 0.000000e+00 |

TABLE 6

(NA = 1.43, Field 26 mm × 4 mm, λ = 193.368 nm)

| SURF | RADIUS | | THICKNESS | MATERIAL | INDEX | SEMIDIAM. |
|---|---|---|---|---|---|---|
| 0 | 0.0 | | 33.328277 | AIR | 1.00000000 | 60.000 |
| 1 | 125.423165 | AS | 39.381886 | SIO2V | 1.56078570 | 84.801 |
| 2 | 709.497823 | | 59.414818 | AIR | 1.00000000 | 83.548 |
| 3 | 79.770086 | | 72.839860 | SIO2V | 1.56078570 | 74.420 |
| 4 | −7894.689621 | AS | 0.999254 | AIR | 1.00000000 | 56.081 |
| 5 | 143.898987 | | 19.237811 | SIO2V | 1.56078570 | 52.060 |
| 6 | −1394.168197 | AS | 7.859217 | AIR | 1.00000000 | 45.524 |
| 7 | 0.000000 | | 0.000000 | AIR | 1.00000000 | 37.967 |
| 8 | 0.000000 | | 0.000000 | AIR | 1.00000000 | 37.967 |
| 9 | 0.000000 | | 11.108673 | SIO2V | 1.56078570 | 37.967 |
| 10 | 0.000000 | | 23.511091 | AIR | 1.00000000 | 40.856 |
| 11 | −55.718551 | | 10.000013 | SIO2V | 1.56078570 | 42.493 |
| 12 | −102.551694 | AS | 8.003481 | AIR | 1.00000000 | 52.519 |
| 13 | 511.527060 | | 57.834537 | SIO2V | 1.56078570 | 71.401 |
| 14 | −150.217681 | AS | 74.264364 | AIR | 1.00000000 | 81.772 |
| 15 | 8804.728166 | | 35.276951 | SIO2V | 1.56078570 | 104.420 |
| 16 | −230.388597 | AS | 255.039195 | AIR | 1.00000000 | 105.829 |
| 17 | −183.675460 | AS | −217.563958 | REFL | 1.00000000 | 157.401 |
| 18 | 175.620649 | AS | 256.746229 | REFL | 1.00000000 | 132.028 |
| 19 | 1026.529181 | | 16.273026 | SIO2V | 1.56078570 | 90.271 |
| 20 | 576.004624 | AS | 20.879052 | AIR | 1.00000000 | 88.137 |
| 21 | −631.413011 | AS | 14.126113 | SIO2V | 1.56078570 | 96.166 |
| 22 | 333.872671 | | 8.110194 | AIR | 1.00000000 | 94.623 |
| 23 | 458.707671 | | 9.999868 | SIO2V | 1.56078570 | 94.188 |
| 24 | 100.000313 | AS | 28.009244 | AIR | 1.00000000 | 88.344 |
| 25 | 151.636815 | AS | 33.333907 | SIO2V | 1.56078570 | 98.892 |
| 26 | 543.261033 | | 63.310058 | AIR | 1.00000000 | 98.684 |
| 27 | −167.390818 | | 14.623211 | SIO2V | 1.56078570 | 100.078 |
| 28 | −688.309357 | AS | 0.998886 | AIR | 1.00000000 | 115.617 |
| 29 | 332.505824 | AS | 94.263537 | SIO2V | 1.56078570 | 120.127 |
| 30 | −217.367591 | | 0.999935 | AIR | 1.00000000 | 141.549 |
| 31 | −267.020721 | AS | 67.142894 | SIO2V | 1.56078570 | 146.996 |
| 32 | −192.400766 | | 0.999267 | AIR | 1.00000000 | 160.498 |
| 33 | −2578.056552 | AS | 34.043593 | SIO2V | 1.56078570 | 176.477 |
| 34 | −693.145656 | | 0.999643 | AIR | 1.00000000 | 177.506 |
| 35 | 226.012968 | | 82.068157 | SIO2V | 1.56078570 | 175.869 |
| 36 | −55234.220533 | AS | 20.996927 | AIR | 1.00000000 | 172.449 |
| 37 | 0.000000 | | −20.000000 | AIR | 1.00000000 | 169.179 |
| 38 | 185.156153 | | 67.450297 | SIO2V | 1.56078570 | 148.671 |
| 39 | 326.610325 | AS | 0.995822 | AIR | 1.00000000 | 143.665 |
| 40 | 98.488886 | | 50.685375 | SIO2V | 1.56078570 | 89.499 |
| 41 | 301.439835 | AS | 0.993715 | AIR | 1.00000000 | 77.497 |
| 42 | 51.449934 | | 37.971346 | SIO2V | 1.56078570 | 45.346 |
| 43 | 0.000000 | | 3.444444 | HINDLIQ | 1.65002317 | 20.928 |
| 44 | 0.000000 | | 0.000000 | AIR | 0.00000000 | 15.000 |

TABLE 6A

Aspheric constants

| | SRF | | | | |
|---|---|---|---|---|---|
| | 1 | 4 | 6 | 12 | 14 |
| K | 0 | 0 | 0 | 0 | 0 |
| C1 | −1.440356e−08 | 3.122125e−07 | 3.836320e−07 | 1.106775e−08 | 9.298523e−08 |
| C2 | −1.752625e−12 | 1.676522e−10 | −6.546276e−11 | 3.636715e−12 | 2.649787e−13 |
| C3 | 2.942100e−17 | −5.105907e−14 | 4.899339e−13 | 4.323305e−16 | −3.093644e−16 |
| C4 | 1.788663e−20 | 1.114434e−17 | −1.185110e−18 | 1.320474e−18 | 3.026582e−21 |
| C5 | −9.754594e−24 | −3.170464e−21 | −2.930288e−20 | −8.168008e−22 | 1.705571e−24 |
| C6 | 1.332348e−27 | 2.338905e−24 | 2.623345e−23 | 2.905983e−25 | 8.193107e−29 |
| C7 | −7.771782e−32 | −8.127202e−28 | −7.972293e−27 | −6.766107e−29 | −1.901142e−32 |
| C8 | 1.383256e−36 | 9.438082e−32 | 7.027508e−31 | 4.576582e−33 | 6.517480e−37 |

TABLE 6A-continued

Aspheric constants

| | | | | | |
|---|---|---|---|---|---|
| C9 | 7.911958e−43 | 0.000000e+00 | 0.000000e+00 | 0.000000e+00 | 0.000000e+00 |

SRF

| | 16 | 17 | 18 | 20 | 21 |
|---|---|---|---|---|---|
| K | 0 | −1.47549 | −1.66477 | 0 | 0 |
| C1 | −3.055831e−09 | −1.480898e−08 | 3.286578e−08 | −5.843366e−09 | 2.459957e−07 |
| C2 | 7.317622e−13 | 7.821034e−14 | 6.163971e−14 | 1.625896e−11 | 5.987349e−12 |
| C3 | 2.249490e−18 | −7.161768e−19 | 5.344011e−18 | 1.065083e−15 | 6.479545e−16 |
| C4 | 7.940841e−22 | 2.511385e−24 | 1.263328e−22 | −9.515654e−20 | −1.813713e−19 |
| C5 | −5.178929e−26 | −6.091369e−29 | −8.169468e−27 | −1.591536e−24 | 4.953064e−23 |
| C6 | 5.281870e−30 | −2.043338e−33 | 6.743067e−31 | 3.026790e−27 | −7.928887e−27 |
| C7 | −3.353122e−34 | 1.613406e−37 | −2.317602e−35 | −5.465176e−31 | 5.506149e−31 |
| C8 | 9.463451e−39 | −2.333870e−42 | 3.923355e−40 | 2.633473e−35 | −1.341455e−35 |
| C9 | 0.000000e+00 | 0.000000e+00 | 0.000000e+00 | 0.000000e+00 | 0.000000e+00 |

SRF

| | 24 | 25 | 28 | 29 | 31 |
|---|---|---|---|---|---|
| K | 0 | 0 | 0 | 0 | 0 |
| C1 | −7.751433e−08 | −4.290436e−08 | 6.165390e−08 | −6.456694e−08 | 8.476629e−09 |
| C2 | −2.754696e−12 | 3.761587e−12 | 1.031916e−13 | 1.160870e−14 | −1.086692e−12 |
| C3 | −2.225313e−15 | −4.234610e−16 | 2.212823e−16 | 3.808351e−17 | 7.735145e−17 |
| C4 | 1.446064e−20 | 1.782336e−20 | 4.539218e−21 | −8.802581e−21 | −4.284691e−21 |
| C5 | 4.984753e−23 | 1.407720e−24 | −1.301533e−24 | 6.194380e−25 | 1.938614e−25 |
| C6 | −1.082004e−26 | −2.529259e−28 | 3.053978e−29 | −3.091905e−29 | −4.876497e−30 |
| C7 | 1.034552e−30 | 1.429029e−32 | −6.711606e−34 | 9.745310e−34 | 8.525426e−35 |
| C8 | −4.292435e−35 | −3.841172e−37 | 3.513032e−38 | −1.519059e−38 | −1.661287e−39 |
| C9 | 0.000000e+00 | 0.000000e+00 | 0.000000e+00 | 0.000000e+00 | 0.000000e+00 |

SRF

| | 33 | 36 | 39 | 41 |
|---|---|---|---|---|
| K | 0 | 0 | 0 | 0 |
| C1 | −2.778469e−08 | −9.415578e−09 | −7.878711e−08 | 1.443354e−07 |
| C2 | 7.744503e−13 | 1.442964e−12 | 2.178146e−12 | −3.492872e−12 |
| C3 | −4.610928e−18 | −3.000470e−17 | 1.992467e−17 | 9.181082e−16 |
| C4 | 9.040210e−22 | 2.061801e−23 | −3.803391e−21 | −1.175810e−19 |
| C5 | −2.413564e−26 | 1.426843e−26 | 1.234881e−25 | 1.557836e−23 |
| C6 | −1.158171e−31 | −2.998325e−31 | −1.953610e−30 | −7.297400e−29 |
| C7 | 9.116330e−36 | 2.916986e−36 | 2.147071e−35 | −1.510979e−31 |
| C8 | −7.559748e−41 | −3.696923e−42 | −1.928382e−40 | 1.515393e−35 |
| C9 | 0.000000e+00 | 0.000000e+00 | 0.000000e+00 | 0.000000e+00 |

TABLE 7

(NA = 1.4, Field 22 mm × 4 mm, λ = 248 nm)

| SURF | RADIUS | | THICKNESS | MATERIAL | INDEX | SEMIDIAM. |
|---|---|---|---|---|---|---|
| 0 | 0.0 | | 29.992670 | AIR | 1.00000000 | 53.500 |
| 1 | 653.240598 | AS | 18.318348 | SIO2V | 1.50885281 | 65.842 |
| 2 | −365.713268 | | 1.000855 | AIR | 1.00000000 | 67.869 |
| 3 | 114.184820 | | 38.607428 | SIO2V | 1.50885281 | 76.932 |
| 4 | 14279.978307 | | 39.128800 | AIR | 1.00000000 | 75.507 |
| 5 | 96.798533 | | 36.522490 | SIO2V | 1.50885281 | 60.980 |
| 6 | −315.770767 | AS | 1.001629 | AIR | 1.00000000 | 56.603 |
| 7 | 99.535380 | | 20.174780 | SIO2V | 1.50885281 | 44.240 |
| 8 | 416.473162 | AS | 6.818293 | AIR | 1.00000000 | 35.725 |
| 9 | 0.000000 | | 12.971859 | SIO2V | 1.50885281 | 32.481 |
| 10 | 0.000000 | | 26.743491 | AIR | 1.00000000 | 36.173 |
| 11 | −42.994498 | | 10.650650 | SIO2V | 1.50885281 | 37.959 |
| 12 | −70.367470 | AS | 0.999387 | AIR | 1.00000000 | 46.424 |
| 13 | 145.553871 | | 37.148359 | SIO2V | 1.50885281 | 67.810 |
| 14 | −217.233129 | AS | 6.993072 | AIR | 1.00000000 | 68.661 |
| 15 | 290.244888 | | 10.457832 | SIO2V | 1.50885281 | 68.245 |
| 16 | −466.018827 | AS | 214.186182 | AIR | 1.00000000 | 67.417 |
| 17 | −144.012605 | AS | −176.687397 | REFL | 1.00000000 | 133.877 |
| 18 | 147.329912 | AS | 214.186254 | REFL | 1.00000000 | 102.871 |
| 19 | 379.597660 | | 65.173208 | SIO2V | 1.50885281 | 109.701 |
| 20 | 305.132479 | AS | 63.679376 | AIR | 1.00000000 | 110.150 |

TABLE 7-continued (NA = 1.4, Field 22 mm × 4 mm, λ = 248 nm)

| SURF | RADIUS | | THICKNESS | MATERIAL | INDEX | SEMIDIAM. |
|---|---|---|---|---|---|---|
| 21 | −269.118371 | AS | 9.999970 | SIO2V | 1.50885281 | 92.303 |
| 22 | −883.269999 | | 1.811020 | AIR | 1.00000000 | 94.707 |
| 23 | 763.849876 | | 12.833019 | SIO2V | 1.50885281 | 95.588 |
| 24 | 2106.484168 | | 16.154538 | AIR | 1.00000000 | 95.609 |
| 25 | 6080.966577 | | 9.999954 | SIO2V | 1.50885281 | 96.004 |
| 26 | 136.284910 | AS | 14.859810 | AIR | 1.00000000 | 96.605 |
| 27 | 154.811601 | AS | 37.935374 | SIO2V | 1.50885281 | 108.871 |
| 28 | 279.943910 | | 33.702605 | AIR | 1.00000000 | 108.711 |
| 29 | −800.821409 | | 10.095951 | SIO2V | 1.50885281 | 109.607 |
| 30 | 485.149710 | AS | 30.640013 | AIR | 1.00000000 | 117.439 |
| 31 | 273.555007 | AS | 76.635611 | SIO2V | 1.50885281 | 140.669 |
| 32 | −233.675925 | | 0.999595 | AIR | 1.00000000 | 145.322 |
| 33 | −270.203095 | AS | 41.130599 | SIO2V | 1.50885281 | 151.297 |
| 34 | −207.501599 | | 1.275991 | AIR | 1.00000000 | 155.422 |
| 35 | −1527.951152 | AS | 32.269797 | SIO2V | 1.50885281 | 168.358 |
| 36 | −456.971047 | | 0.999546 | AIR | 1.00000000 | 168.976 |
| 37 | −563.003697 | | 9.999638 | SIO2V | 1.50885281 | 168.208 |
| 38 | 506.448238 | | 18.397374 | AIR | 1.00000000 | 170.847 |
| 39 | 968.306159 | | 56.254693 | SIO2V | 1.50885281 | 171.925 |
| 40 | −481.032953 | | 0.999572 | AIR | 1.00000000 | 172.848 |
| 41 | 198.110385 | | 90.807379 | SIO2V | 1.50885281 | 168.447 |
| 42 | −2609.386746 | AS | 42.466179 | AIR | 1.00000000 | 164.351 |
| 43 | 0.000000 | | −41.471341 | AIR | 1.00000000 | 149.458 |
| 44 | 169.792964 | | 69.081666 | SIO2V | 1.50885281 | 137.734 |
| 45 | 303.324575 | AS | 0.998888 | AIR | 1.00000000 | 127.953 |
| 46 | 94.322967 | | 51.090800 | SIO2V | 1.50885281 | 85.742 |
| 47 | 281.007303 | AS | 0.992310 | AIR | 1.00000000 | 72.465 |
| 48 | 41.090639 | | 34.385987 | SIO2V | 1.50885281 | 38.609 |
| 49 | 0.000000 | | 3.100000 | HINDLIQ | 1.54000000 | 20.176 |
| 50 | 0.000000 | | 0.000000 | AIR | 0.00000000 | 13.376 |

TABLE 7A

Aspheric constants

| | SRF | | | | |
|---|---|---|---|---|---|
| | 1 | 6 | 8 | 12 | 14 |
| K  | 0 | 0 | 0 | 0 | 0 |
| C1 | 4.109095e−08 | −1.346090e−07 | 9.118863e−07 | −6.439573e−07 | −7.079604e−08 |
| C2 | −1.313622e−11 | 9.351616e−11 | −3.550262e−11 | −1.092456e−10 | −2.626843e−12 |
| C3 | −2.392755e−15 | 1.621653e−14 | −3.392460e−13 | −2.031345e−14 | 1.327904e−14 |
| C4 | 2.475982e−18 | −2.620207e−17 | 8.140363e−16 | −1.063165e−17 | −4.696441e−18 |
| C5 | −1.037068e−21 | 1.034804e−20 | −1.280714e−18 | 6.467391e−21 | 8.817684e−22 |
| C6 | 2.235947e−25 | −1.774033e−24 | 1.211571e−21 | −7.023593e−24 | −8.986893e−26 |
| C7 | −2.586875e−29 | 8.964125e−29 | −6.448904e−25 | 2.746170e−27 | 3.868400e−30 |
| C8 | 1.236236e−33 | 6.185212e−33 | 1.447618e−28 | −5.810639e−31 | 0.000000e+00 |
| C9 | 0.000000e+00 | 0.000000e+00 | 0.000000e+00 | 0.000000e+00 | 0.000000e+00 |

| | SRF | | | | |
|---|---|---|---|---|---|
| | 16 | 17 | 18 | 20 | 21 |
| K  | 0 | −1.45775 | −1.83722 | 0 | 0 |
| C1 | 6.945775e−07 | −3.412007e−08 | 6.193558e−08 | −3.109383e−07 | 8.372577e−08 |
| C2 | −1.241973e−11 | −2.858543e−14 | −2.089424e−13 | 1.340373e−11 | −4.039533e−11 |
| C3 | −1.428559e−14 | −3.958002e−18 | 5.059560e−17 | −1.676906e−15 | 2.351724e−15 |
| C4 | 4.210468e−18 | −7.353206e−22 | −7.033596e−21 | 1.630093e−19 | −9.842591e−20 |
| C5 | −5.868892e−22 | 9.324628e−26 | 1.084408e−24 | −5.354202e−24 | −2.554630e−24 |
| C6 | 4.753725e−26 | −6.613076e−30 | −9.448872e−29 | −1.863288e−28 | 3.555610e−27 |
| C7 | −2.382796e−30 | 2.359901e−34 | 4.431901e−33 | 1.812770e−32 | −3.972713e−31 |
| C8 | 1.094961e−34 | −3.472580e−39 | −8.582414e−38 | −3.773564e−37 | 1.319933e−35 |
| C9 | 0.000000e+00 | 0.000000e+00 | 0.000000e+00 | 0.000000e+00 | 0.000000e+00 |

| | SRF | | | | |
|---|---|---|---|---|---|
| | 26 | 27 | 30 | 31 | 33 |
| K  | 0 | 0 | 0 | 0 | 0 |
| C1 | 2.629466e−07 | 8.545958e−08 | 3.655805e−08 | −4.763604e−08 | 3.601748e−08 |
| C2 | −6.032307e−11 | −2.145432e−11 | 6.600671e−14 | −6.285032e−13 | −1.973990e−12 |

TABLE 7A-continued

Aspheric constants

| | | | | | |
|---|---|---|---|---|---|
| C3 | 4.115006e−15 | 2.565185e−15 | 2.373005e−16 | 3.094769e−17 | 1.186960e−16 |
| C4 | 9.653713e−20 | −1.852408e−19 | −7.493365e−21 | −3.114180e−21 | −6.773288e−21 |
| C5 | −3.517240e−23 | 6.234756e−24 | 7.025571e−26 | 1.968354e−25 | 3.072666e−25 |
| C6 | 1.888856e−27 | 1.261154e−29 | −9.922060e−29 | −7.958451e−30 | −6.701724e−30 |
| C7 | −5.970790e−33 | −7.609409e−33 | 6.767386e−33 | 3.084285e−34 | −3.035935e−35 |
| C8 | −1.659292e−36 | 1.369810e−37 | −1.261882e−37 | −6.449225e−39 | 2.080234e−39 |
| C9 | 0.000000e+00 | 0.000000e+00 | 0.000000e+00 | 0.000000e+00 | 0.000000e+00 |

| | SRF | | | |
|---|---|---|---|---|
| | 35 | 42 | 45 | 47 |
| K | 0 | 0 | 0 | 0 |
| C1 | −4.593953e−08 | 9.357056e−10 | −5.958614e−08 | 1.316330e−07 |
| C2 | 1.909892e−12 | 1.834803e−12 | −1.226696e−12 | 4.539461e−12 |
| C3 | −3.876246e−17 | −6.913911e−17 | 3.205011e−16 | −2.430970e−16 |
| C4 | 3.862713e−21 | 2.191590e−21 | −2.237625e−20 | 1.502555e−20 |
| C5 | −1.628876e−25 | −5.955750e−26 | 1.111251e−24 | 2.618292e−23 |
| C6 | 2.383768e−30 | 1.113483e−30 | −4.197471e−29 | −5.953209e−27 |
| C7 | −1.262864e−36 | −1.161039e−35 | 1.031636e−33 | 7.413162e−31 |
| C8 | −1.769733e−40 | 3.437890e−41 | −1.143283e−38 | −3.154140e−35 |
| C9 | 0.000000e+00 | 0.000000e+00 | 0.000000e+00 | 0.000000e+00 |

What is claimed is:

1. A catadioptric projection objective for imaging a pattern provided in an object surface of the projection objective onto an image surface of the projection objective comprising:
an object-side imaging subsystem creating a final intermediate image closest to the image surface from radiation coming from the object surface;
an image-side imaging subsystem directly imaging the final intermediate image onto the image surface;
the image-side imaging subsystem including a last optical element closest to the image surface and creating a convergent beam having an aperture sin $\alpha \geq 0.8$ in the last optical element to provide an image-side numerical aperture NA;
the image-side imaging subsystem including, in order, along a propagation direction of radiation:
a primary negative lens group having overall negative refractive power;
an intermediate positive lens group having overall positive refractive power;
a secondary negative lens group having overall negative refractive power; and
a final positive lens group having overall positive refractive power and including the last optical element, where the last optical element has only a single refractive index and has a convex entry surface having a radius $R_{LOE}$ of curvature with $R_{LOE}/NA<40$ mm.

2. Projection objective according to claim 1, wherein a primary positive lens group having overall positive refractive power is arranged between the final intermediate image and the primary negative lens group.

3. Projection objective according to claim 1, wherein the secondary negative lens group interposed between the intermediate positive lens group and the final positive lens group is positioned in a region of largest beam diameter within the image-side imaging subsystem.

4. Projection objective according to claim 1, wherein at least one negative lens in the secondary negative lens group is arranged in the region of a local maximum of beam diameter where the beam diameter within the secondary negative lens group exceeds 90% of the maximum beam diameter within the image-side imaging subsystem.

5. Projection objective according to claim 1, wherein negative refractive power provided by the primary negative lens group is concentrated in a region of small beam diameter at or close to a local minimum of the beam diameter.

6. Projection objective according to claim 1, wherein at least one negative lens of the primary negative lens group is arranged in a region of a local minimum of beam diameter within the image-side imaging subsystem.

7. Projection objective according to claim 1, wherein at least one negative lens of the primary negative lens group has a concave exit surface facing the image surface where large angles of incidence with SINIMAX>0.93 occur, where SINIMAX is the maximum value for the sine of the angle of incidence on the concave exit surface.

8. Projection objective according to claim 7, wherein the concave exit surface is an aspheric surface.

9. Projection objective according to claim 1, wherein marginal ray angles of rays within the secondary negative lens group are significantly smaller than those within the primary negative lens group such that the condition $MRA2_{max}<MRA1_{max}$ is fulfilled, where $MRA2_{max}$ and $MRA1_{max}$ are the maximum values of the marginal ray angle within the secondary and primary negative lens group, respectively.

10. Projection objective according to claim 1, wherein the secondary negative lens group is positioned such that an essentially collimated beam with marginal ray angles $|MRA|<10°$ enters the secondary negative lens group.

11. Projection objective according to claim 1, wherein at least one lens of the secondary negative lens group has a concave entry surface facing the object surface.

12. Projection objective according to claim 11, wherein the concave entry surface is provided on a negative lens.

13. Projection objective according to claim 11, wherein the concave entry surface is an aspheric surface.

14. Projection objective according to claim 1, wherein a primary chief ray height CRH1 in a center region of the primary negative lens group is larger than the secondary chief ray height CRH2 in a center region of the secondary negative lens group and a primary marginal ray height MRH1 in the primary negative lens group is smaller than a secondary marginal ray height MRH2 within the secondary negative lens group.

15. Projection objective according to claim 1, wherein the final positive lens group adjacent to the image surface extends across the pupil surface of the image-side imaging subsystem, which is the pupil surface closest to the image surface.

16. Projection objective according to claim 1, wherein at least two meniscus-shaped positive lenses having concave exit surfaces facing the image surface are arranged between the pupil surface closest to the image surface and the image surface.

17. Projection objective according to claim 16, wherein at least one of the concave exit surfaces is formed aspherical to reduce aberrations of the marginal rays by reducing the angles of incidence.

18. Projection objective according to claim 1, wherein at least one aspheric lens surface arranged in a region of convergent beam is designed as a convergence-enhancing aspheric surface according to $MRA_{AS}/MRA_S > 1.2$, where $MRA_{AS}$ is a marginal ray angle immediately downstream of the aspheric lens surface and $MRA_S$ is a value for the marginal ray angle in the absence of an aspheric deformation at a corresponding spherical base lens surface.

19. Projection objective according to claim 18, wherein at least one of three lenses closest to the image surface has an image-side concave surface designed as the convergence-enhancing aspheric surface.

20. Projection objective according to claim 1, wherein at least one aspheric lens surface arranged in a region of diverging beam is designed as a divergence-reducing aspheric surface according to $MRA_S/MRA_{AS} > 1.2$, where $MRA_{AS}$ is a marginal ray angle immediately downstream of the aspheric lens surface and $MRA_S$ is a value for the marginal ray angle in the absence of an aspheric deformation at a corresponding spherical base lens surface.

21. Projection objective according to claim 20, wherein at least one of three lenses immediately upstream of a pupil surface within the image-side imaging subsystem has an image-side convex surface designed as the divergence-reducing aspheric surface.

22. Projection objective according to claim 1, wherein the image-side imaging subsystem includes an axially extended partial section where radiation is essentially collimated such that marginal ray angles within the partial section do not exceed 10°.

23. Projection objective according to claim 22, wherein the partial section has an axial length $L_C$ according to $L_C > 0.5 D_{MAX}$, where $D_{MAX}$ is a maximum lens diameter within the image-side imaging subsystem.

24. Projection objective according to claim 1, wherein the object-side imaging subsystem includes a first refractive imaging subsystem to generate a first intermediate image from radiation coming from the object surface, and a second, catadioptric or catoptric imaging subsystem for imaging the first intermediate image into the final intermediate image.

25. Projection objective according to claim 1, wherein the projection objective has an even number of concave mirrors and one straight (unfolded) optical axis common to all lenses and mirrors (in-line system).

26. Projection objective according to claim 1, wherein the object-side imaging subsystem has a first axial length L1 measured between an entry surface facing the object surface and an exit surface facing the final intermediate image, wherein the image-side imaging subsystem has an axial length $L_{ISIS}$ measured between the entry surface facing the final intermediate image and the exit surface facing the image surface, and wherein the condition $L_{ISIS} > 1.8$ L1 is fulfilled.

27. Projection objective according to claim 1, wherein the projection objective has exactly two intermediate images and three pupil surfaces.

28. Projection objective according to claim 1, wherein the last optical element is made of a material having refractive index $n_{LOE}$ and wherein the image-side numerical aperture is in the range $0.95*n_{LOE} < NA < n_{LOE}$.

29. Projection objective according to claim 1, wherein the last optical element is made of fused silica and wherein the image-side numerical aperture is in the range $1.35 \leq NA \leq 1.50$.

30. Projection objective according to claim 1, wherein all refractive optical elements are made of the same material and wherein the image-side numerical aperture is in the range $1.35 \leq NA \leq 1.50$.

31. Projection objective according to claim 30, wherein the same material used for all refractive optical elements is fused silica.

32. Projection objective according to claim 1, wherein $NA \geq 1.35$.

33. Projection objective according to claim 1, wherein the projection objective is designed for use with an immersion liquid having refractive index $n_{IL}$, all refractive optical elements are made of the same material, and $NA/n_{IL} > 0.92$.

34. Projection objective according to claim 1, wherein the secondary negative lens group is positioned between a region of lowest beam diameter and a region with largest beam diameter within the image-side imaging subsystem.

35. Projection objectives according to claim 1, wherein an aperture stop is positioned at a first pupil position nearest to the object surface.

36. A catadioptric projection objective for imaging a pattern provided in an object surface of the projection objective onto an image surface of the projection objective comprising:
   an object-side imaging subsystem creating a final intermediate image closest to the image surface from radiation coming from the object surface;
   an image-side imaging subsystem directly imaging the final intermediate image onto the image surface;
   the image-side imaging subsystem including a last optical element closest to the image surface and creating a convergent beam having an aperture sin α>0.8 in the last optical element to provide an image-side numerical aperture NA;
   the image-side imaging subsystem including, in order, along a propagation direction of radiation:
   a primary negative lens group having overall negative refractive power;
   an intermediate positive lens group having overall positive refractive power;
   a secondary negative lens group having overall negative refractive power; and
   a final positive lens group having overall positive refractive power and including the last optical element, where the last optical element has a convex entry surface having a radius $R_{LOE}$ of curvature with $R_{LOE}/NA < 40$ mm,
   wherein the last optical element is made of a material having refractive index $n_{LOE}$ and wherein the image-side numerical aperture is in the range $0.95*n_{LOE} < NA < n_{LOE}$.

37. A catadioptric projection objective for imaging a pattern provided in an object surface of the projection objective onto an image surface of the projection objective comprising:

an object-side imaging subsystem creating a final intermediate image closest to the image surface from radiation coming from the object surface;

an image-side imaging subsystem directly imaging the final intermediate image onto the image surface;

the image-side imaging subsystem including a last optical element closest to the image surface and creating a convergent beam having an aperture $\sin \alpha \geqq 0.8$ in the last optical element to provide an image-side numerical aperture NA;

the image-side imaging subsystem including, in order, along a propagation direction of radiation:

a primary negative lens group having overall negative refractive power;

an intermediate positive lens group having overall positive refractive power;

a secondary negative lens group having overall negative refractive power; and a final positive lens group having overall positive refractive power and including the last optical element, wherein the last optical element has a convex entry surface having a radius $R_{LOE}$ of curvature with $R_{LOE}/NA<40$ mm, wherein the last optical element is a plano-convex lens having a convex entry surface and a plane exit surface and wherein the radius of curvature $R_{LOE}$ of the convex entry surface is smaller than 50 mm.

38. A catadioptric projection objective for imaging a pattern provided in an object surface of the projection objective onto an image surface of the projection objective comprising:

an object-side imaging subsystem creating a final intermediate image closest to the image surface from radiation coming from the object surface;

an image-side imaging subsystem directly imaging the final intermediate image onto the image surface;

the image-side imaging subsystem including a last optical element closest to the image surface and creating a convergent beam having an aperture $\sin \alpha \geqq 0.8$ in the last optical element to provide an image-side numerical aperture NA;

the image-side imaging subsystem including, in order, along a propagation direction of radiation:

a primary negative lens group having overall negative refractive power;

an intermediate positive lens group having overall positive refractive power;

a secondary negative lens group having overall negative refractive power; and a final positive lens group having overall positive refractive power and including the last optical element, wherein the last optical element has a convex entry surface having a radius $R_{LOE}$ of curvature with $R_{LOE}/NA<40$ mm, and wherein the last optical element has an edge thickness $ET_{LOE}$ according to $ET_{LOE}<NA\times 10$ [mm], where the edge thickness is the axial thickness of the last optical element at the edge of the optically utilized area.

* * * * *

UNITED STATES PATENT AND TRADEMARK OFFICE
CERTIFICATE OF CORRECTION

| | | |
|---|---|---|
| PATENT NO. | : 7,848,016 B2 | Page 1 of 1 |
| APPLICATION NO. | : 11/797571 | |
| DATED | : December 7, 2010 | |
| INVENTOR(S) | : Aurelian Dodoc | |

It is certified that error appears in the above-identified patent and that said Letters Patent is hereby corrected as shown below:

Column 2, Line 27: Delete "reproducably" and insert -- reproducibly --

Column 2, Line 62: Delete "an other" and insert -- another --

Column 3, Line 40: Delete "catoptic" and insert -- catoptric --

Column 6, Line 22: Delete "con verging" and insert -- converging --

Column 13, Line 15 (approx): Delete "catoptic" and insert -- catoptric --

Column 13, Line 25-26 (approx): After "undercorrection" insert -- . --

Signed and Sealed this
Thirty-first Day of July, 2012

David J. Kappos
*Director of the United States Patent and Trademark Office*